(12) United States Patent
Watanabe et al.

(10) Patent No.: US 7,298,123 B2
(45) Date of Patent: *Nov. 20, 2007

(54) APPARATUS AND CIRCUIT FOR POWER SUPPLY, AND APPARATUS FOR CONTROLLING LARGE CURRENT LOAD

(75) Inventors: Yuichi Watanabe, Tokyo (JP); Takashi Iijima, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/267,332

(22) Filed: Nov. 7, 2005

(65) Prior Publication Data

US 2006/0113971 A1    Jun. 1, 2006

Related U.S. Application Data

(63) Continuation-in-part of application No. 10/917,346, filed on Aug. 13, 2004, now abandoned, which is a continuation of application No. 09/926,281, filed as application No. PCT/JP01/00885 on Feb. 8, 2001, now Pat. No. 6,861,828.

(30) Foreign Application Priority Data

| Feb. 8, 2000 | (JP) | ............................. 2000-031231 |
| Apr. 4, 2000 | (JP) | ............................. 2000-102485 |
| Apr. 4, 2000 | (JP) | ............................. 2000-102486 |

(51) Int. Cl.
*G05F 1/40* (2006.01)

(52) U.S. Cl. .................................................. 323/282

(58) Field of Classification Search ................ 323/265, 323/282, 351; 363/20, 21.01
See application file for complete search history.

(56) References Cited

U.S. PATENT DOCUMENTS

| 5,863,811 | A | * | 1/1999 | Kawai et al. .................. 438/47 |
| 6,011,416 | A | | 1/2000 | Mizuno et al. |
| 6,150,798 | A | | 11/2000 | Ferry et al. |
| 6,597,210 | B2 | | 7/2003 | Carsten |
| 6,849,882 | B2 | * | 2/2005 | Chavarkar et al. .......... 257/191 |
| 6,861,828 | B2 | | 3/2005 | Watanabe |
| 7,116,567 | B2 | * | 10/2006 | Shelton et al. ............. 361/91.5 |

FOREIGN PATENT DOCUMENTS

| EP | 860 946 | 8/1998 |
| JP | 7-303373 | 11/1995 |
| JP | 9-233810 | 9/1997 |
| JP | 10-41797 | 2/1998 |
| JP | 11-164550 | 6/1999 |
| JP | 11-297713 | 10/1999 |

OTHER PUBLICATIONS

J.C. Zolper, 1999 International Electron Devices Meeting, Technical Digest, pp. 389-392, "Wide Bandgap Semiconductor Microwave Technologies: From Promise to Practice", 1999.
S. Yoshida, The Furukawa Electric Co., Ltd., vol. 68, No. 7, pp. 787-792, "Electronic Device Using GaN", 1999.

* cited by examiner

*Primary Examiner*—Adolf Berhane
(74) *Attorney, Agent, or Firm*—Oblon, Spivak, McClelland, Maier & Neustadt, P.C.

(57) ABSTRACT

A power supply apparatus includes a diode that is disposed in the path of a main current that is a subject of power control. The diode includes a substrate; a gallium-nitride buffer layer formed on the substrate; a gallium-nitride layer formed on the gallium-nitride buffer layer; and an n-type aluminum-gallium-nitride layer formed on the gallium-nitride layer.

20 Claims, 13 Drawing Sheets

APPARATUS AND CIRCUIT FOR POWER SUPPLY, AND APPARATUS FOR CONTROLLING LARGE CURRENT LOAD

CROSS-REFERENCE TO RELATED APPLICATIONS

This application is a continuation-in-part of U.S. patent application Ser. No. 10/917,346, filed Aug. 13, 2004, now abandoned, which is a continuation of U.S. patent application Ser. No. 09/926,281, filed Dec. 12, 2001, now U.S. Pat. No. 6,861,828. The priority of these prior applications is expressly claimed and their disclosures are hereby incorporated by reference in their entirety.

BACKGROUND OF THE INVENTION

1. Field of the Invention

The present invention relates to various power supply apparatuses used in automobiles, electric vehicles, construction machinery, various public welfare devices (such as video devices, television sets, and audio devices), various industrial devices (such as personal computers, communication devices, and FA control devices), and so on. Furthermore, the present invention relates to a power supply circuit and a large current load control apparatus of switching power supply using GaN-FETs.

2. Description of the Related Art

Heretofore, power semiconductor devices such as diodes, thyristors, triacs, GTO (Gate Turn Off) thyristors, bipolar transistors, MOS-FETs, and IGBTs (Insulated Gate Bipolar Transistors) are used in various power supply apparatuses. In these power semiconductor devices, a main current that flows through the power semiconductor device is controlled by switching control or analog control. These power semiconductor devices are devices serving as nuclei for implementing stabilized power supply apparatuses, such as switching regulators and linear regulators, and inverters for performing conversion to power having an arbitrary frequency and an arbitrary output voltage.

In these power semiconductor devices, there are switching loss caused by superposition of transient voltage and current at the time of switching and conduction loss caused at the time of conduction. These losses are converted mainly to heat. By the way, the conduction loss has such a characteristic as to become small as the on-resistance is decreased. This on-resistance corresponds to composite resistance of the channel resistance, bulk resistance, and so on existing within the semiconductor except contact resistance between electrodes and semiconductor layer interfaces in the power semiconductor device. Heat generated by the power semiconductor device causes a temperature rise of the power semiconductor device itself. Due to this temperature rise, the power semiconductor device operates at high temperature. Due to this high temperature operation, heat generation of the power semiconductor device is promoted. Such positive feedback is caused. As a result, thermal destruction of the power semiconductor device is caused by thermal runaway.

Usually in the power supply apparatus, therefore, the power semiconductor device itself is provided with a radiation mechanism and in addition, with a radiator such as radiation fins for radiating heat generated by the power semiconductor device. Furthermore, a radiation fan is provided in order to improve the radiation effect in some cases. Furthermore, there is provided a fail safe mechanism that senses the temperature of the power semiconductor device and stops operation of the power semiconductor device when the temperature rises to such a value as to cause thermal runaway.

However, the radiator is formed of a good thermal conductive material, such as aluminum, in order to provide the radiator with a function of heat sink as well. This results in a problem that the whole power supply apparatus becomes large in weight and capacity. Especially as for mobile power supply apparatuses for vehicles or portable power supply apparatuses, emergence of power supply apparatuses reduced in size and weight is demanded strongly.

For example, in a conventional power supply apparatus shown in FIG. 16, a radiator 302 having a large weight and a large capacity is needed. The power supply apparatus shown in FIG. 16 is a DC-DC converter power supply apparatus of a vehicle. A MOS-FET using a Si semiconductor material is incorporated in the power supply apparatus as a switching element. The apparatus main body 301 encloses all the elements forming the power supply apparatus. On the top of the apparatus main body 301, a radiator 302 formed of aluminum is provided. On a junction interface between the radiator 302 and the apparatus main body 301, a MOS-FET, which is not illustrated, stick to the radiator 302. Heat generated by the MOS-FET is absorbed by the radiator 302, and radiated by fins disposed on the top of the radiator 302. Because of installation of the radiator 302, the weight and volume of the whole power supply apparatus become excessively large.

Furthermore, the radiator needs to stick to the power semiconductor device in order to favorably transfer the heat from the power semiconductor device. This brings about limitation on design that the radiator needs to be disposed with due regard to the outer periphery of the casing of the power supply apparatus and the radiation path. This results in a problem that the degree of freedom of the power supply apparatus is reduced. In addition, as for devices such as vehicles using the power supply apparatus, design of the whole device must be changed according to the disposition position of the power supply apparatus. Thus, there is also a problem that the design of the whole device is largely affected.

In addition, in designing the radiator, it is necessary to conduct sufficient radiation design with due regard to the ambient environment of the power supply apparatus. In addition, it is necessary to prevent the power semiconductor device, which is a heat source, from affecting other circuit elements having low heat-resisting property. This results in a problem that much time and labor are required for radiation design and arrangement design of other circuit elements included in the power supply apparatus.

Furthermore, a heat protection circuit for preventing thermal runaway of the power supply apparatus is needed. This heat protection circuit monitors the temperature changes of important components, such as the power semiconductor device, included in the power supply apparatus. When the temperature has risen to a predetermined value, the heat protection circuit conducts fail safe control, such as stopping the power supply apparatus and causing shift to a low dissipation mode. This heat protection circuit is a complicated circuit that senses the temperature, output current, and so on and conducts a shift to fail safe control by using a logic processing circuit. Thus, there is a problem that the power supply apparatus must have a heat protection circuit having such a complicated circuit.

Recently as semiconductor devices having high heat-resisting property, high breakdown voltage, high operation rate and low conduction loss, GaN (gallium nitride) FETs (Field Effect Transistors) have been developed.

Heretofore, such power supply circuits have been applied to, for example, automobiles, various public welfare devices (such as video, television and audio devices), and industrial devices (such as personal computers, communication devices, and FA control devices).

The above described power supply circuit includes a transformer. A transistor made of, for example, a power MOS element turns on and off according to a gate signal. As a result, an output voltage is generated on a secondary winding side.

In the above described power supply circuit, however, the power MOS element used as the transistor, such as a power MOS-FET (2SK2313) generates much heat. Therefore, it is necessary to perform the radiation design accurately. A channel temperature Tch-max of the power MOS-FET itself at an ambient temperature of 85° C. is calculated as $$T_{ch\_max} = T_{a\_max} + P_{total} \times R_{th(ch-a)}$$
$$= 85° \text{ C.} + 2 \text{ W} \times 50° \text{ C./W}$$
$$= 185° \text{ C.}$$

where $T_{a\_max}$: ambient temperature
$P_{total}$: total loss
$R_{th(ch-a)}$: thermal resistance between channel and environment.

The temperature rises up to the channel temperature or higher. Therefore, it is necessary to provide a radiation plate. Supposing derating of 50° C. for a channel temperature of 150° C., the radiation plate design is represented as $$\theta_f < \theta_{ch-a} - (\theta_i + (\theta_c + \theta_s)) = 7.5° \text{ C./W} - (0.833° \text{ C./W} + 0.8° \text{ C./W})$$
$$= 5.9° \text{ C./W}$$

where $\theta_f$: thermal resistance of radiator
$\theta_{ch-a}$: total thermal resistance between channel and environment
$\theta_i$: thermal resistance between junction portion and case (internal thermal resistance)
$\theta_c + \theta_s$: thermal resistance between case and radiator From the foregoing description, it is necessary to select a radiator having a thermal resistance of 5.9° C./W or less. For example, therefore, a radiation plate made of an aluminum plate of 100 cm² having a thickness of 1 mm becomes necessary. As a result, the conventional power supply circuit has a problem that the circuit configuration becomes large and heavy because of the radiation plate.

Furthermore, heretofore, such a large current load control apparatus is applied to, for example, lighting control of head lamps of automobiles.

In the above described large current load control apparatus, lighting control of a head lamp is conducted by turning on and off a power MOS-FET formed of, for example, an on/off control switching element provided on a power supply line, which connects a battery to the lamp, under the control of a microcomputer.

In this control apparatus, however, the power MOS-FET used as the switching element of on/off control generates much heat. Therefore, it is necessary to perform the radiation design accurately. A channel temperature $T_{ch\_max}$ of the power MOS-FET is calculated as $$T_{ch\_max} = (T_{a\_max}) + (R_{on\_max}) \times (I_{o\_max}) \times (I_{o\_max}) \times R_{th(ch-a)}$$
$$= 85° \text{ C.} + 0.013 \, \Omega \times 10 \text{ A} \times 10 \text{ A} \times 50° \text{ C./W}$$
$$= 150° \text{ C.}$$

where $T_{a\_max}$: ambient temperature
$R_{on\_max}$: on-resistance
$I_{o\_max}$: current value
$R_{th(ch-a)}$: thermal resistance between channel and environment.

The temperature rises up to the channel temperature. Therefore, it is necessary to provide a radiation plate. Supposing derating of 50° C. for a channel temperature of 150° C., the radiation plate design is represented as $$\theta_f < \theta_{j-a} - (\theta_i + (\theta_c + \theta_s)) = 11.5° \text{ C./W} - (0.833° \text{ C./W} + 0.8° \text{ C./W})$$
$$= 9.9° \text{ C./W}$$

where $\theta_f$: thermal resistance of radiator
$\theta_{j-a}$: total thermal resistance between channel junction portion and the outside air
$\theta_i$: thermal resistance between junction portion and case (internal thermal resistance)
$\theta_c + \theta_s$: thermal resistance between case and radiator From the foregoing description, it is necessary to select a radiator having a thermal resistance of 9.9° C./W or less. For example, therefore, a radiation plate made of an aluminum plate of 6 cm² having a thickness of 1 mm and a weight of approximately 10 g becomes necessary. As a result, the conventional large load control apparatus has a problem that the circuit configuration becomes large and heavy because of the radiation plate.

Therefore, it is one object of the present invention is to provide a power supply apparatus capable of implementing reduction of the size and weight, conducting flexibly design including the radiation design, and remarkably reducing the time and labor required for the design.

Furthermore, it is an another object of the present invention is to provide a power supply circuit capable of reducing the heat generated by the transistor, thereby making the radiation plate unnecessary, and implementing reduction of the size and weight of the circuit.

Furthermore, it is still another object of the present invention is to provide a large current load control apparatus capable of reducing the heat generated by the on/off control switching element, thereby making the radiation plate unnecessary, and implementing reduction of the size and weight of the circuit.

SUMMARY OF THE INVENTION

A power supply apparatus according to one aspect of the present invention includes a diode that is disposed in the path of a main current that is a subject of power control. The diode includes: a substrate; a gallium-nitride buffer layer formed on the substrate; a gallium-nitride layer formed on the gallium-nitride buffer layer; and an n-type aluminum-gallium-nitride layer formed on the gallium-nitride layer.

A power supply circuit according to another aspect of the present invention has a transformer, and conducts on/off control on voltage applied to a primary winding of said transformer, and thereby supplies a stabilized power supply voltage to a secondary winding side of said transformer. The power supply circuit includes a GaN-diode that includes: a substrate; a gallium-nitride buffer layer formed on the substrate; a gallium-nitride layer formed on the gallium-nitride buffer layer; and an n-type aluminum-gallium-nitride layer formed on the gallium-nitride layer. The GaN-diode is connected to the secondary winding of said transformer and on/off-controlled by a gate signal.

DETAILED DESCRIPTION OF THE PREFERRED EMBODIMENTS

Embodiments of the power supply apparatus, power supply circuit, and the large current load control apparatus according to the present invention will be described in detail.

Figure 1:
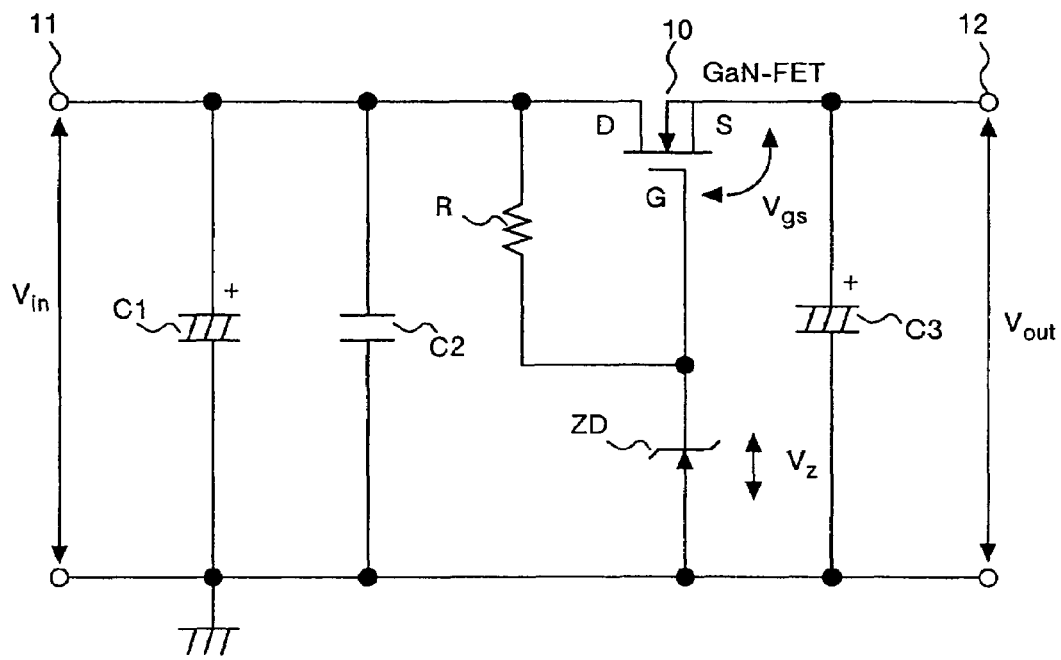
FIG. 1 is a diagram showing a schematic circuit configuration of a power supply apparatus that is a first embodiment of the present invention.

FIG. 1 is a diagram showing a schematic circuit configuration of the power supply apparatus according to a first embodiment of the present invention. This power supply apparatus is a linear regulator. This power supply apparatus is a stabilized power supply apparatus for converting an input voltage $V_{in}$ of 12 VDC to 5VDC of maximum 10 A and outputting the 5VDC as an output voltage $V_{out}$.

In FIG. 1, a GaN-FET 10 is connected between an input terminal 11 of an input voltage $V_{in}$ side and an output terminal 12 of an output voltage $V_{out}$ side. Drain D and source S of the GaN-FET 10 are connected to the input terminal 11 side and the output terminal 12 side, respectively. Gate G of the GaN-FET 10 is connected to a Zener diode ZD. In other words, the GaN-FET 10 controls the main current, which flows from the input voltage $V_{in}$ side to the output terminal $V_{out}$ side.

An electrolytic capacitor C1 is a capacitor for smoothing a voltage waveform in the case where the input voltage $V_{in}$ is full-wave rectified by a bridge diode and so on. The Zener diode ZD and a resistor R form a shunt regulator, and conducts voltage setting so as to convert the input voltage of 12 V to the output voltage $V_{out}$ of 5 V. Assuming now that the terminal voltage of the Zener diode ZD is a voltage $V_z$ and the gate-source voltage of the GaN-FET 10 is a voltage $V_{gs}$, the output voltage $V_{out}$ is represented by the following equation (1).

In other words, it follows that $$V_{out}=V_z-V_{gs} \quad (1)$$

where the voltage $V_z$ of the Zener diode ZD is concretely set to 5.6 V and the voltage $V_{gs}$ is 0.3 V. Therefore, the output voltage $V_{out}$ is output as 5.6 V−0.3 V=5.3 V. A ceramic capacitor C2 is a capacitor for preventing oscillation of the GaN-FET 10. Further more, an electrolytic capacitor C3 is a capacitor for smoothing an instantaneous variation of a load, which is not illustrated, connected to the output voltage $V_{out}$. As a result, the power supply apparatus shown in FIG. 1 supplies a stabilized power supply voltage having an output voltage of 5.3 V to the load.

As a general FET, a Si semiconductor, which can be easily subjected to fine processing, is used. In the case of an FET that makes fast operation possible, a GaAs compound semiconductor is used. The GaN-FET 10 is an FET that uses a GaN compound semiconductor and that has high heat-resisting property, high breakdown voltage, high operation rate and low conduction loss. The GaN-FET 10 has, for example, a HEMT type or an MES (Metal-semiconductor) type FET structure.

Figure 2:
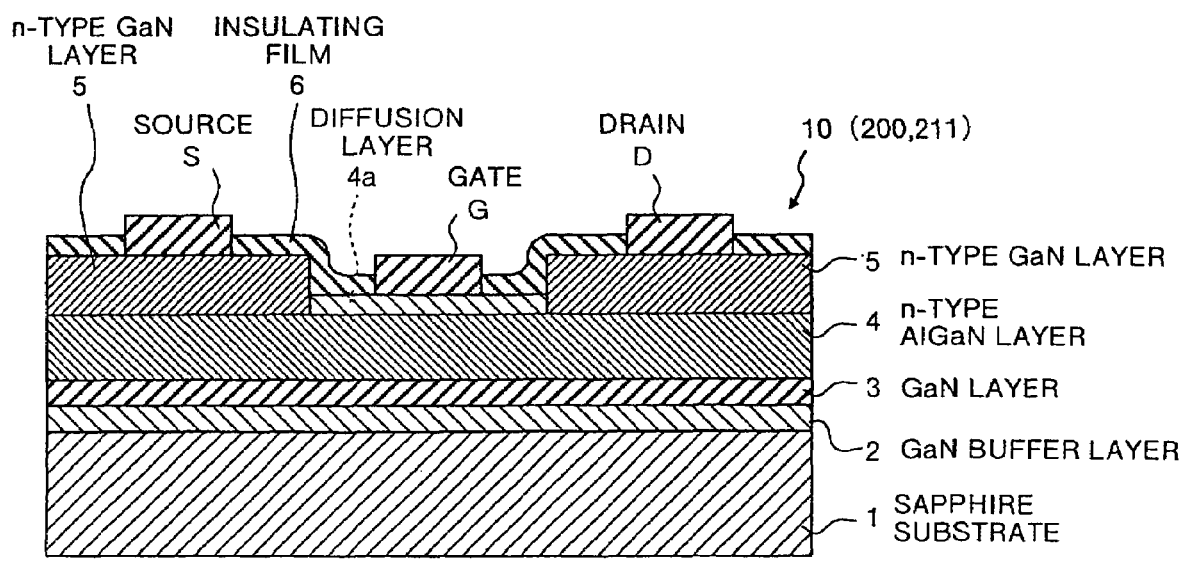
FIG. 2 is a diagram showing a configuration of GaN-FET shown in FIG. 1.

In the GaN-FET 10 shown in FIG. 2, a GaN buffer layer 2 is formed on a semi-insulating sapphire substrate 1. On the GaN buffer layer 2, a semi-insulating GaN layer 3 is formed. On the semi-insulating GaN layer 3, an n-type AlGaN layer 4 is formed. In addition, on a part of a central portion of a surface layer portion of the n-type AlGaN layer 4, a diffusion layer 4a with In and C or Mg doped is formed. On the diffusion layer 4a, an electrode of the gate G is loaded. On the remaining portions of the surface layer portion of the n-type AlGaN layer 4, an n-type GaN layer 5 is formed. Over one of the remaining portions of the surface layer portion of the n-type AlGaN layer 4, an electrode of the source S is loaded. Over the other of the remaining portions of the surface layer portion of the n-type AlGaN layer 4, an electrode of the drain D is loaded. Portions other than the electrodes are covered by an insulating film 6 of SiO.

Each of the semiconductor layers of the GaN-FET 10 shown in FIG. 2 is formed of a GaN compound semiconductor, and formed by using an epitaxial crystal growth method such as the MOCVD method or the MBE method. The term GaN compound semiconductor is a general term of GaN, AlGaN, InGaN, InAlGaN, InGaNAs, InGaNP and so on.

In the GaN-FET 10, the on-resistance per unit area becomes nearly 1/100 or less that of the FET of the Si semiconductor, and the conduction loss is small. Therefore, the amount of heat generated by the GaN-FET 10 becomes extremely small. Furthermore, the operation temperature of the Si semiconductor is in the range of approximately 125° C. to 150° C. at most, whereas the GaN-FET 10 can operate stably even at 500° C. A current of 10 A at most flows through the GaN-FET 10. Therefore, channel (junction) generated heat maximum temperature T1chmax of the GaN-FET 10 will now be compared with channel generated heat maximum temperature T2chmax of the FET of the Si semiconductor through which a maximum current of 10 A flows, and studied.

By using a maximum ambient temperature $T_{a\_max}$, a maximum on-resistance. $R_{on\_max}$, a maximum on-current $I_{on\_max}$, and a thermal resistance coefficient $R_{th(ch-a)}$ between the channel and environment, the channel generated heat maximum temperature $T_{ch\_max}$ can be represented by the following equation (2).

$$T_{ch\_max} = T_{a\_max} + R_{on\_max} \times I_{on\_max} \times I_{on\_max} \times R_{th(ch-a)} \quad (2)$$

Assuming that the maximum ambient temperature $T_{a\_max}$ is 85° C., the thermal resistance coefficient $R_{th(ch-a)}$ is 50° C./W, and the maximum on-resistance $R_{on\_max}$ of the Si semiconductor is 0.013 Ω, the channel generated heat maximum temperature $T2_{ch\_max}$ of the FET of the Si semiconductor becomes $$T2_{ch\_max} = 85°\ C. + 0.013\ \Omega \times 10\ A \times 10\ A \times 50°\ C./W$$
$$= 150°\ C.$$

On the other hand, in the GaN-FET 10, the maximum on-resistance $R_{on\_max}$ is 1/100 or less that of the FET of the Si semiconductor. Therefore, the channel generated heat maximum temperature $T1_{ch\_max}$ of the GaN-FET 10 becomes $$T2_{ch\_max} = 85°\ C. + (0.013\ \Omega/100) \times 10\ A \times 10\ A \times 50°\ C./W$$
$$= 85.65°\ C.$$

When a maximum current of 10 A flows, therefore, the temperature rises to 150° C. in the FET of the Si semiconductor. In the GaN-FET 10, however, the temperature is nearly the same as the ambient temperature $T_{a\_max}$, and there is little temperature rise. Therefore, a radiator for cooling the GaN-FET 10 of the power supply apparatus shown in FIG. 1 becomes unnecessary.

Figure 3:
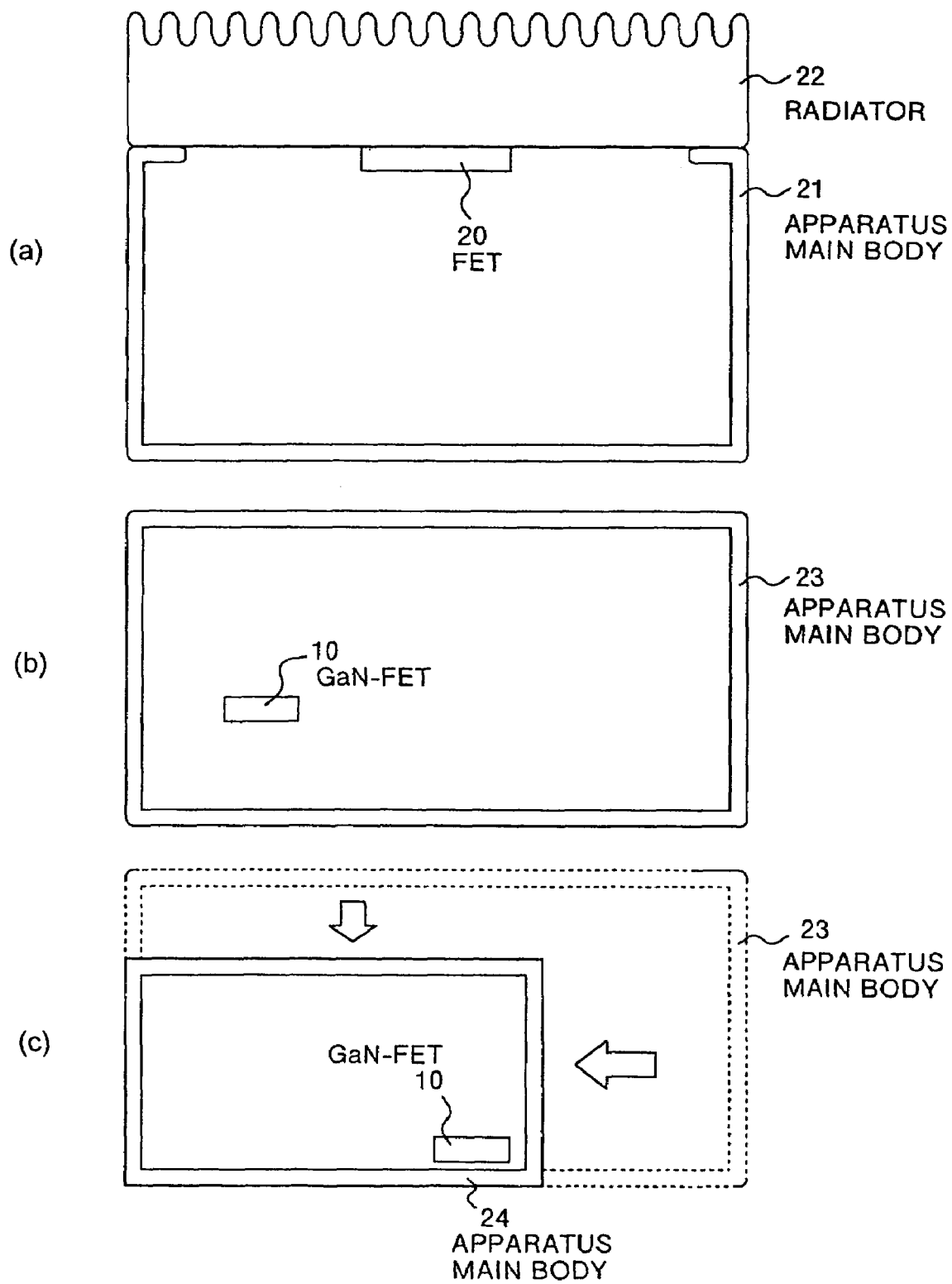
FIG. 3(a) to (c) are diagrams showing differences in structure between a power supply apparatus using an FET of a Si semiconductor and a power supply apparatus of a first embodiment using a GaN-FET.

FIG. 3 is a diagram showing differences in structure between the power supply apparatus using the FET of the Si semiconductor and the power supply apparatus using the GaN-FET 10. FIG. 3(a) is a sectional of a power supply apparatus corresponding to the conventional power supply apparatus shown in FIG. 10. In FIG. 3(a), a FET 20 of a Si semiconductor is used. The FET 20 generates much heat. Accordingly, a radiator 22 made of aluminum having high conductivity is provided on the top of an apparatus main body 21. One end surface of the radiator 22 is opposed to the apparatus main body 21, and it serves as a lid of the apparatus main body 21. On the other end surface of the radiator 22, radiation fins are provided to radiate heat generated by the FET 20 to the environment. Most of the heat generated by the conventional power supply apparatus is occupied by heat generated by the FET 20. Therefore, the FET 20 is joined to the one end surface of the radiator 22 so as to make the contact area large.

On the other hand, FIG. 3(b) is a sectional view of the power supply apparatus using the GaN-FET 10. The power supply apparatus shown in FIG. 3(b) differs from the power supply apparatus shown in FIG. 3(a) in that the radiator 22 is not provided. As described above this is because the power supply apparatus shown in FIG. 3(b) uses the GaN-FET 10, which generates less heat. In the power supply apparatus using the GaN-FET 10, therefore, the radiator 22, which is large in weight and volume, can be eliminated. As a result, reduction of the size and weight of the power supply apparatus can be realized, and it becomes unnecessary to conduct the radiation design calculation for design of the radiator 22.

Furthermore, since the GaN-FET 10 itself does not generate heat, the GaN-FET 10 can be disposed in an arbitrary position of the apparatus main body 23. Therefore, arrangement of components included in the power supply apparatus, i.e., layout design can be conduct flexibly.

Furthermore, since heat generation of the GaN-FET 10 need not be considered, the radiation design of the whole power supply apparatus is facilitated. In addition, since the layout design can be conducted flexibly, it becomes possible to integrate the layout of components included in the power supply apparatus as shown in FIG. 3(c). As a result, it becomes possible to obtain a power supply apparatus 24 contracted as compared with the power supply apparatus main body 23. Accordingly, further reduction of the size and weight of the power supply apparatus is realized. Furthermore, because of reduced size and weight of the power supply apparatus and less heat generated by the power supply apparatus, this power supply apparatus can be disposed in an arbitrary position of a device such as a vehicle using the power supply apparatus.

The reason why the size of the GaN-FET 10 shown in FIGS. 3(b) and (c) is reduced as compared with the size of the FET 20 shown in FIG. 3(a) is that the amount of heat generated by the GaN-FET 10 is small and consequently the radiation structure of the GaN-FET 10 itself becomes unnecessary and the size and weight of the GaN-FET 10 itself become small.

The power supply apparatus shown in FIG. 1 is an example of the simplest linear regulator. In addition, a circuit for stabilizing the output voltage $V_{out}$ under the load variation may be provided. For example, the voltage $V_z$ of the Zener diode ZD may be adjusted by using resistors connected in series across the output voltage $V_{out}$, thereby conducting voltage division, using semifixed resistors as respective resistors, and adjusting the semifixed resistors finely.

Furthermore, there may be provided a protection circuit that uses a differential amplifier for comparing a voltage divided by resistors connected in series with a reference voltage and thereby conducts protection against overcurrent and load shortcircuit. Since the temperature of the GaN-FET 10 itself is hardly raised even by an overcurrent, however, the thermal protection circuit may be simplified or eliminated. In this case, other components can be prevented from being destroyed by providing a fuse or the like on the input voltage $V_{in}$ side. As a result, in the power supply apparatus using the GaN-FET 10, the thermal protection circuit can be simplified or eliminated. Therefore, reduction in size and weight of the power supply apparatus is further promoted, and the time and labor required for the design of the power supply apparatus can be reduced.

According to the first embodiment, the GaN-FET 10 having a low on-resistance is used, and consequently the radiator 22 of the power supply apparatus is not needed, and the GaN-FET 10 can be disposed in an arbitrary position in the power supply apparatus. Therefore, the power supply apparatus can be remarkably reduced in size and weight. Furthermore, the time and labor required for the radiation design including the radiator and the design of the thermal protection circuit can be reduced. In addition, the time and labor required for the radiation design including the radiator and the design of thermal protection circuit can be reduced, and the GaN-FET 10 can be disposed in an arbitrary position in the power supply apparatus, therefore the time and labor required for the layout design of the whole power supply apparatus can also be reduced. In addition, since the amount of heat generated by the GaN-FET 10 itself is small and the GaN-FET 10 has a heat-resisting property of 500° C. or more, it becomes possible to use the power supply apparatus for a long time and the maintenance required for the power supply apparatus is also reduced.

A second embodiment of the present invention will now be described. In a power supply apparatus according to the second embodiment, the GaN-FETs 10 are connected in parallel.

Figure 4:
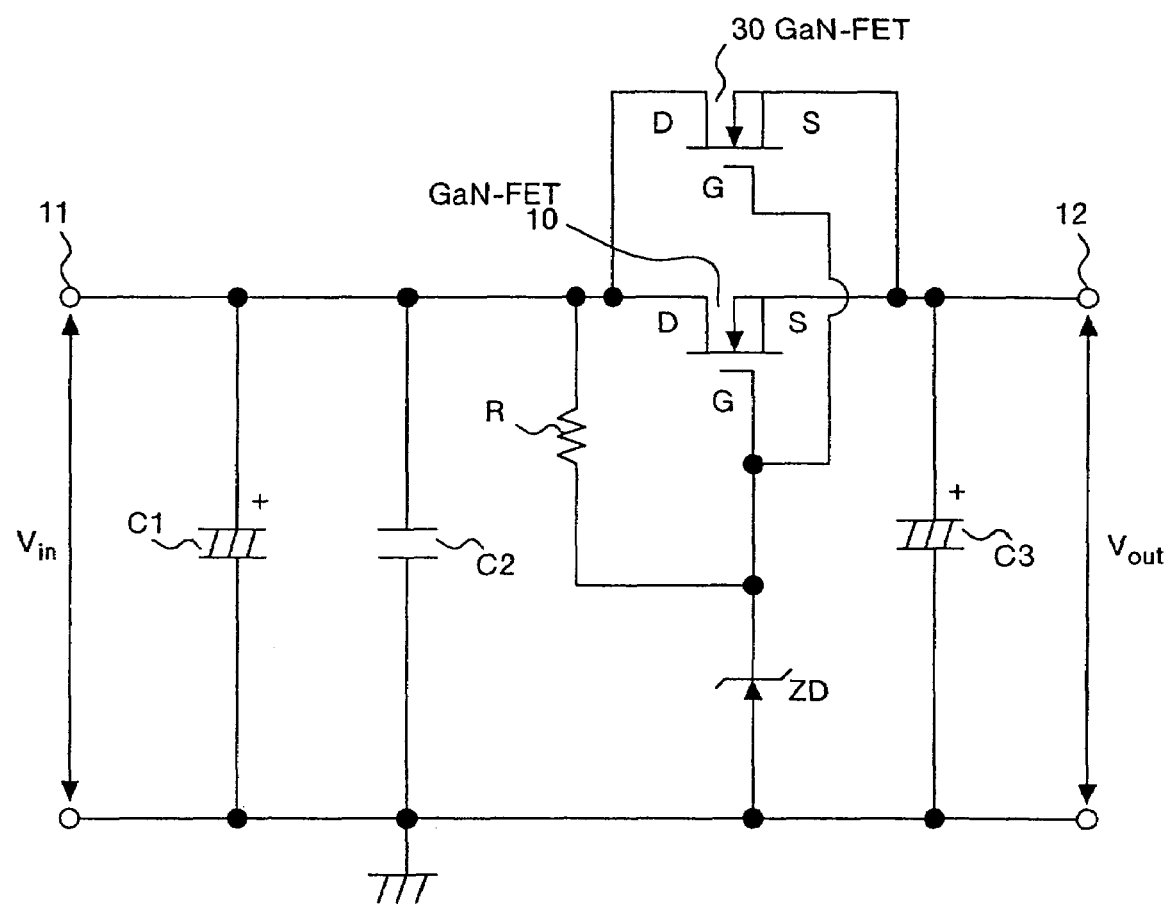
FIG. 4 is a diagram showing a schematic circuit configuration of a power supply apparatus that is a second embodiment of the present invention.

FIG. 4 is a diagram showing a schematic circuit configuration of a power supply apparatus that is an embodiment of the present invention. In the power supply apparatus shown in FIG. 4, a GaN-FET 30 having the same configuration as that of the GaN-FET 10 is connected in parallel with the GaN-FET 10. The parallel connection of the GaN-FET 10 and the GaN-FET 30 unit connecting sources S, drains D and gates G of each of the GaN-FET 10 and together. Remaining configuration is the same as that of the power supply apparatus shown in FIG. 1. The same components are denoted by like characters.

As described above, each of the GaN-FETs 10 and 30 themselves has an extremely small on-resistance. Therefore, the conduction loss is low and the amount of generated heat is small. Therefore, adjacent arrangement of a plurality of GaN-FETs becomes possible. Parallel connection of GaN-FETs that does not cause a large weight change and a large volume change as compared with the case of the GaN-FET 10 alone becomes possible. As a result, the maximum current value of the power supply apparatus can be doubled. In other words, each of the GaN-FETs 10 and 30 shown in FIG. 4 can flow a maximum current of 10 A. By connecting them in parallel, however, a maximum current of 20 A can be flown. As a result, the current supply capability of the whole power supply apparatus can be doubled.

Figure 5:
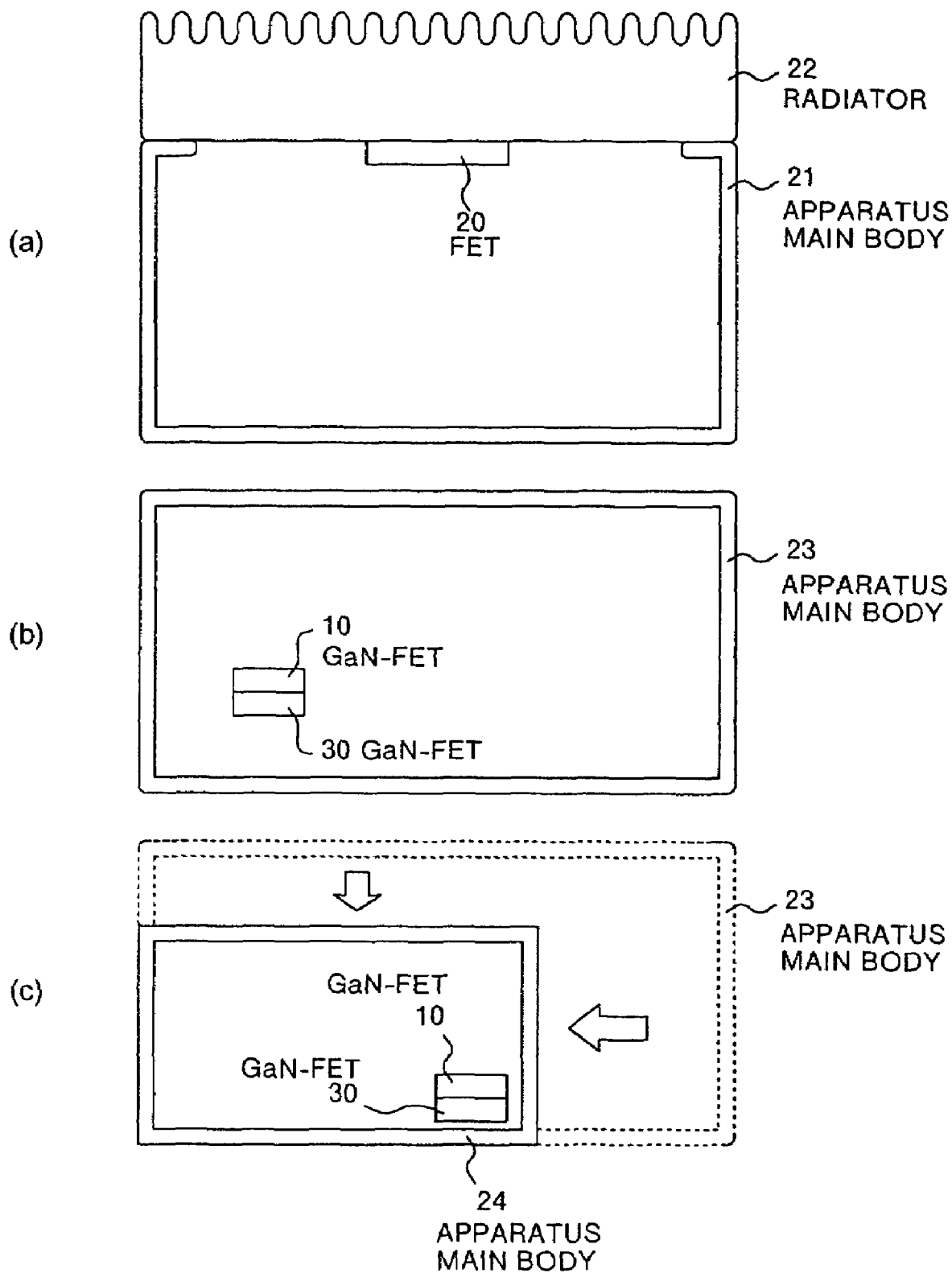
FIG. 5(a) to (c) are diagrams showing differences in structure between a power supply apparatus using an FET of a Si semiconductor and a power supply apparatus of a second embodiment using a GaN-FET.

FIG. 5 is a diagram showing differences in structure between the power supply apparatus using the FET of the Si semiconductor and the power supply apparatus using the GaN-FETs 10 and 30 connected in parallel. FIG. 5(a) is a sectional of the conventional power supply apparatus shown in FIG. 3(a). FIG. 5(b) is a sectional view of the power supply apparatus having the GaN-FETs 10 and 30 connected in parallel and arranged so as to be adjacent to each other. In the case where a power supply apparatus that flows a current of 20 A in the same way as the GaN-FETs 10 and 30 connected in parallel is implemented by using the FET 20 of the Si semiconductor, the amount of heat generated by the FET 20 becomes further large. Therefore, the radiator 22 shown in FIG. 5(a) must be made further larger.

On the other hand, although the apparatus shown in FIG. 5(b) has a capability that is twice the amount of power supplied by the power supply apparatus shown in FIG. 5(a), the radiator 22 is not needed and consequently remarkable reduction in size and weight is realized. Furthermore, since the GaN-FETs 10 and 30 can be arranged so as to be adjacent to each other, design of the power supply apparatus is also facilitated.

In FIG. 5(c), a power supply apparatus further reduced in size and weight is implemented by conducting the layout design of respective components included in the power supply apparatus in the same way as FIG. 3(c).

By the way, the configuration having two GaN-FETs 10 and 30 connected in parallel is shown In FIG. 4. However, the configuration is not limited thereto, but a configuration having three or more GaN-FETs are connected in parallel may be used. In this case, the current supply capability can be further improved.

In addition to the operation effects of the first embodiment, according to the second embodiment, the power supply capability of the power supply apparatus itself can be doubled with the same weight, volume, and scale as those when one GaN-FET is used by only connecting the GaN-FETs 10 and 30 in parallel. Furthermore, in view of the current situation that the development of a GaN-FET capable of flowing a large current therethrough is under progress, the parallel connection of GaN-FETs becomes effective unit which easily realizes the reduction of size and weight in large-power supply apparatuses.

A third embodiment of the present invention will now be described. In both the first and second embodiments, the power supply apparatus serves as a linear regulator. In the third embodiment, however, the above described GaN-FET is used in a power supply apparatus serving as a switching regulator.

Figure 6:
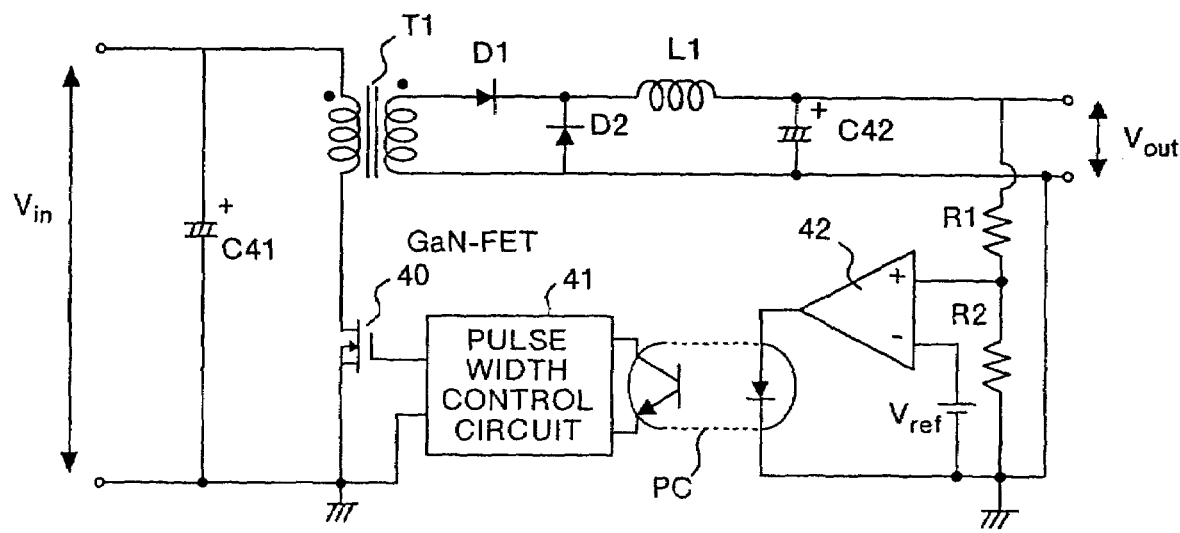
FIG. 6 is a diagram showing a schematic circuit configuration of a power supply apparatus that is a third embodiment of the present invention.

FIG. 6 is a diagram showing a schematic circuit configuration of a power supply apparatus that is a third embodiment of the present invention. The power supply apparatus shown in FIG. 6 is a switching regulator. In other words, in the power supply apparatuses shown in the first and second embodiments the current value is controlled linearly by using the GaN-FETs 10 and 30, whereas in this power supply apparatus the current value is controlled by switching control.

The switching regulator shown in FIG. 6 is a switching regulator of forward type. In this switching regulator, a pulse width modulation (PWM) signal output by a pulse width control circuit 41 is applied to a GaN-FET 40 at its gate, and the GaN-FET 40 is switched. When the GaN-FET 40 is on, energy of an input voltage $V_{in}$ stored across an electrolytic capacitor C41 is transferred to an electrolytic capacitor C42 via a transformer T1, a diode D1 and an inductor L1. When the GaN-FET 40 is off, energy left in the inductor L1 is transferred to the electrolytic capacitor C42 via a diode D2. The electrolytic capacitor C42 outputs it as an output voltage $V_{out}$.

A differential amplifier 42 compares a voltage obtained by voltage division using resistors R1 and R2 connected in series across the output voltage $V_{out}$ with a reference voltage $V_{ref}$, and notifies the pulse width control circuit 41 of the control value caused by a load variation, via a photocoupler PC. The pulse width control circuit 41 applies a PWM signal corresponding to the control value input from the photocoupler PC to the GaN-FET 40 at its gate, controls the current value of the GaN-FET 40, and thereby conducts power control of the output voltage $V_{out}$ side (secondary side).

In this switching regulator, GaN-FET 40 is used as a switching element of a primary side. In the same way as the GaN-FET 10 and 30 in the first and second embodiments, however, the GaN-FET 40 is smaller in on-resistance than the conventional FET of the Si semiconductor. Therefore, the amount of heat generated by the GaN-FET 40 itself is little and the radiator for radiation becomes unnecessary.

Furthermore, since the heat generated by the GaN-FET 40 itself is little and the radiator is unnecessary, the GaN-FET 40 can be disposed arbitrarily in the switching regulator. As a result, reduction of the size and weight of the switching regulator can be realized, and in addition the time and labor required for the design including the radiation design can be reduced.

Figure 7:
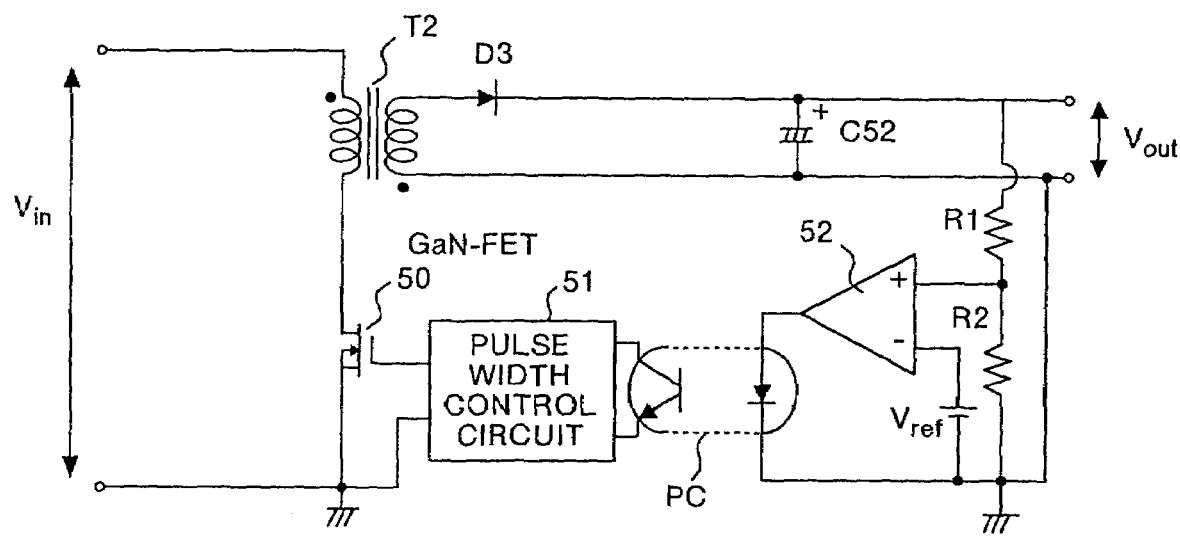
FIG. 7 is a diagram showing a schematic circuit configuration of another power supply apparatus which is a third embodiment of the present invention.

FIG. 7 is a diagram showing a schematic circuit configuration of another power supply apparatus that is the third embodiment of the present invention. Although the power supply apparatus shown in FIG. 6 is a switching regulator of forward type, the power supply apparatus shown in FIG. 7 is a switching regulator of flyback type. In other words, in the power supply apparatus shown in FIG. 6, power energy of the primary side is transferred to the secondary side when the GaN-FET 40 is on. In the power supply apparatus shown in FIG. 7, power energy of the primary side is transferred to the secondary side when a GaN-FET 50 is off.

With reference to FIG. 7, in this switching regulator, a pulse width modulation (PWM) signal output by a pulse width control circuit 51 is applied to the GaN-FET 50 at its gate, and the GaN-FET 50 is switched. A winding direction of a transformer T2 is different from a winding direction of a transformer T1. When the GaN-FET 50 is on, energy of an input voltage $V_{in}$ is stored in the transformer T1. When the GaN-FET 50 is off, energy stored in the transformer T2 is transferred to an electrolytic capacitor C52 via a diode D3 and the electrolytic capacitor C52 outputs an output voltage $V_{out}$.

A differential amplifier 52 compares a voltage obtained by voltage division using resistors R1 and R2 connected in series across the output voltage $V_{out}$ with a reference voltage $V_{ref}$, and notifies the pulse width control circuit 51 of the control value caused by a load variation, via a photocoupler PC. The pulse width control circuit 51 applies a PWM signal corresponding to the control value input from the photocoupler PC to the GaN-FET 50 at its gate, controls the current value of the GaN-FET 50, and thereby conducts power control of the output voltage $V_{out}$ side.

Since the switching regulator of flyback type also uses the GaN-FET 50, the radiator becomes unnecessary, reduction of the size and weight of the whole switching regulator is realized, and design including the radiation design can be conducted flexibly.

Figure 8:
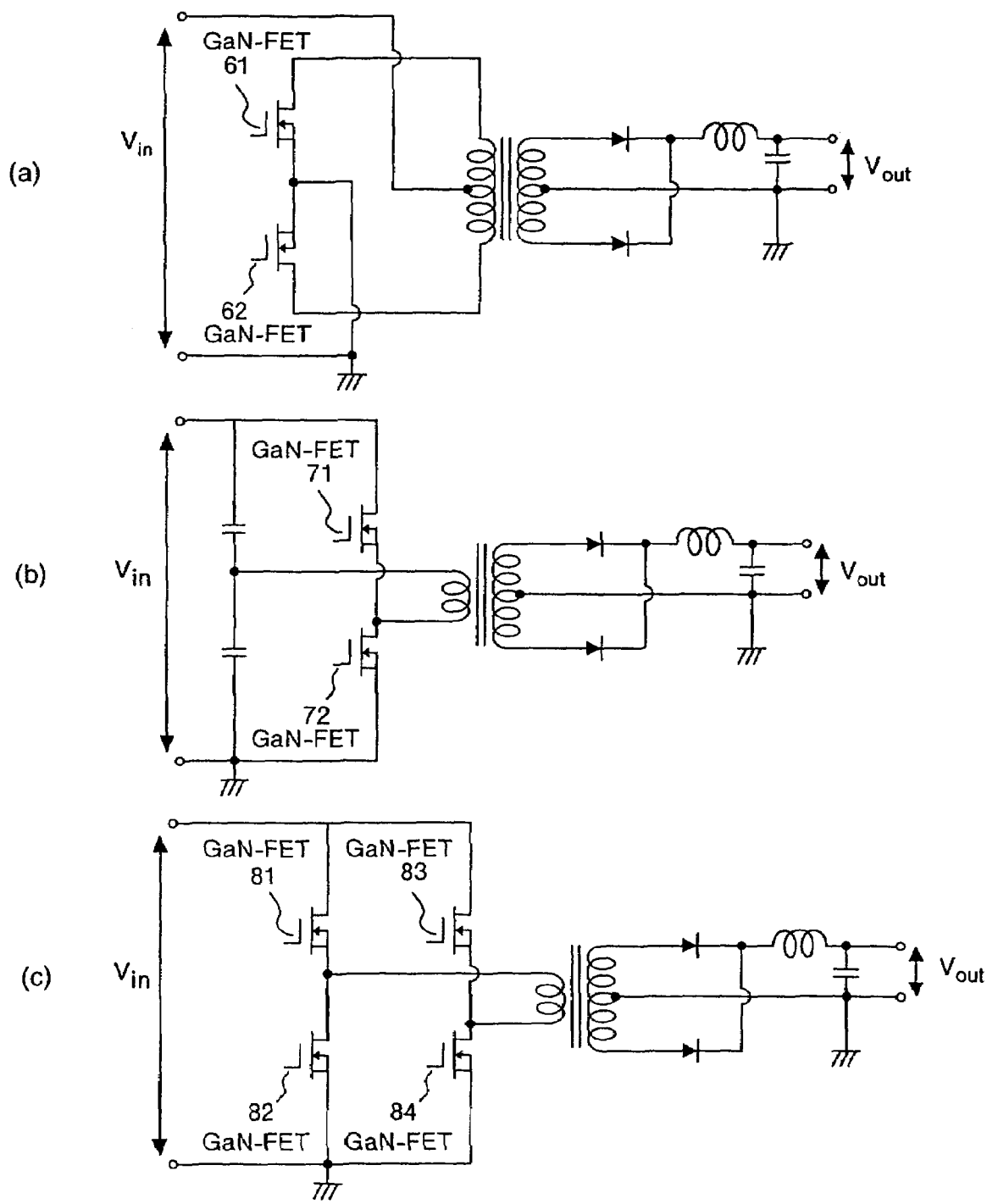
FIG. 8(a) to (c) are diagrams showing a schematic circuit configuration of another power supply apparatus that is a third embodiment of the present invention.

In the same way, FIG. 8 shows an example of another switching regulator using a GaN-FET. FIG. 8(a) shows an example of a switching regulator of push-pull type (center tap type). FIG. 8(b) shows an example of a switching regulator of half bridge type. Furthermore, FIG. 8(c) shows an example of a switching regulator of full bridge type. In switching regulators shown in FIG. 8(a) to 8(c), GaN-FETs 61, 62, 71, 72 and 81 to 84 are used.

Since each of the switching regulators shown in FIG. 8(a) to 8(c) also uses the GaN-FETs 61, 62, 71, 72 and 81 to 84, the radiator becomes unnecessary, reduction of the size and weight of the whole switching regulator is realized, and design including the radiation design can be conducted flexibly. In particular, since a plurality of switching elements are used and a plurality of GaN-FETs 61, 62, 71, 72 and 81 to 84 are used as each of the switching elements, adjacent arrangement of GaN-FETs becomes possible and reduction of size and weight of the switching regulator is promoted.

In other switching regulators as well, the above described operational effect can be achieved by using GaN-FETs as the switching elements of the switching regulator in the same way. For example, the switching regulator may be a self-excited switching regulator using a RCC (ringing choke coil) scheme.

All of the above described switching regulators use the pulse width control. However, switching regulators are not limited thereto. The current value of each GaN-FET may be controlled by the frequency of pulses.

In the same way as the first and second embodiments, according to the third embodiment, the radiator of the power supply apparatus is not required and GaN-FETs can be disposed in arbitrary positions in the power supply apparatus even in the case where the power supply apparatus is a switching regulator, by using GaN-FETs, which are small in on-resistance, as the switching elements. Therefore, the power supply apparatus can be remarkably reduced in size and weight.

Furthermore, the time and labor required for the radiation design including the radiator can be reduced. In addition, since the GaN-FETs can be disposed in arbitrary positions in the power supply apparatus, the time and labor required for the layout design of the whole power supply apparatus can be reduced. In addition, since the amount of heat generated by the GaN-FETs themselves is small and the GaN-FETs have a heat-resisting property, it becomes possible to use the power supply apparatus for a long time and the maintenance required for the power supply apparatus is also reduced.

A fourth embodiment of the present invention will now be described. All of the power supply apparatuses of the first to third embodiments are DC-DC converters. In the fourth embodiment, however, GaN-FETs are used as switching elements used in a DC-AC inverter.

Figure 9:
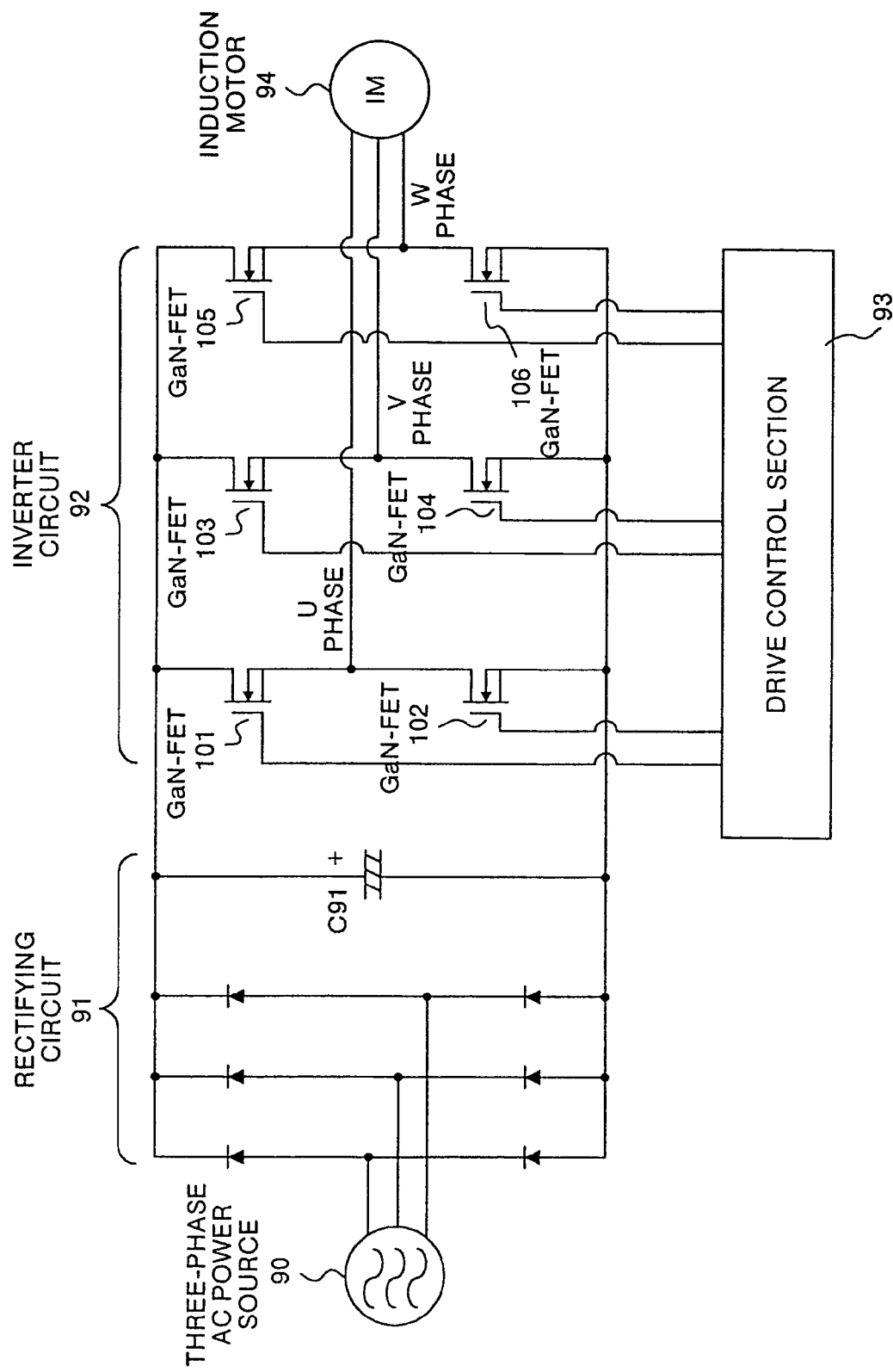
FIG. 9 is a diagram showing a schematic circuit configuration of a power supply apparatus that is a fourth embodiment of the present invention.

FIG. 9 is a diagram showing a schematic circuit configuration of a power supply apparatus that is a fourth embodiment of the present invention. The power supply apparatus shown in FIG. 9 rectifies an AC current supplied from a commercial three-phase AC power source 90, by using a diode group included in a rectifying circuit 91, and smooths the rectified current by using an electrolytic capacitor C91. The smoothed current is converted to an AC current having a desired frequency and a desired output voltage by an inverter circuit 92. The AC current is output to an induction motor (IM) 94.

The inverter circuit 92 includes GaN-FET pairs 101 and 102, 103 and 104, and 105 and 106 serving as switching element pairs respectively corresponding to the U phase, V phase and W phase. A drive control section 93 sends PWM signals corresponding to respective phases to the GaN-FET pairs 101 to 106, and conducts switching control on each of each of the GaN-FET pairs 101 to 106, and three-phase AC power having a desired frequency and out put voltage is supplied. Gates of the GaN-FETs 102, 104 and 106 are supplied with inverted signals of PWM signals supplied to each of the GaN-FETs 101, 103 and 105.

Since the power supply apparatus serving as an inverter shown in FIG. 9 uses the GaN-FETs 101 to 106, the radiator becomes unnecessary, reduction of the size and weight of the whole switching regulator is realized, and design including the radiation design can be conducted flexibly.

Even in the case of other power supply apparatuses serving as inverters, such as an inverter that is used in a rice cooking jar using induction heating and that converts a DC current to a desired AC current by using one switching element, a similar operational effect can be obtained by using a GaN-FET as a switching element.

In the same way as the first to third embodiments, according to the fourth embodiment, the radiator of the power supply apparatus is not required and GaN-FETs can be disposed in arbitrary positions in the power supply apparatus, by using GaN-FETs, which are small in on-resistance, as the switching elements used in an inverter. Therefore, the power supply apparatus can be remarkably reduced in size and weight. Furthermore, the time and labor required for the radiation design for designing the radiator can be reduced. In addition, since the GaN-FETs can be disposed in arbitrary positions in the power supply apparatus, the time and labor required for the layout design of the whole power supply apparatus can be reduced. In addition, since the amount of heat generated by the GaN-FETs themselves is small and the GaN-FETs have a heat-resisting property, it becomes possible to use the power supply apparatus for a long time and the maintenance required for the power supply apparatus is also reduced.

In the foregoing description of the first to fourth embodiments, FETs of MSE type are used as GaN-FETs. However, GaN-FETs are not limited thereto, but they may be FETs of HEMT type or MOS type. Furthermore, various semiconductor elements such as thyristors, triacs, GTO thyristors, bipolar transistors, MOS-FETs, and IGBTs may also be semiconductor elements using GaN compound semiconductors.

Furthermore, in all of the first to fourth embodiments, there has been explained the case where semiconductor elements using GaN compound semiconductors have been applied to the power supply apparatuses. However, the semiconductor elements are not limited thereto, but any semiconductor elements using a semiconductor material capable of making the on-resistance small may be used. For example, semiconductor elements using a SiC compound semiconductor material or semiconductor elements using an AlN compound semiconductor material may be used.

An embodiment of a power supply circuit according to the present invention will now be described.

Figure 10:
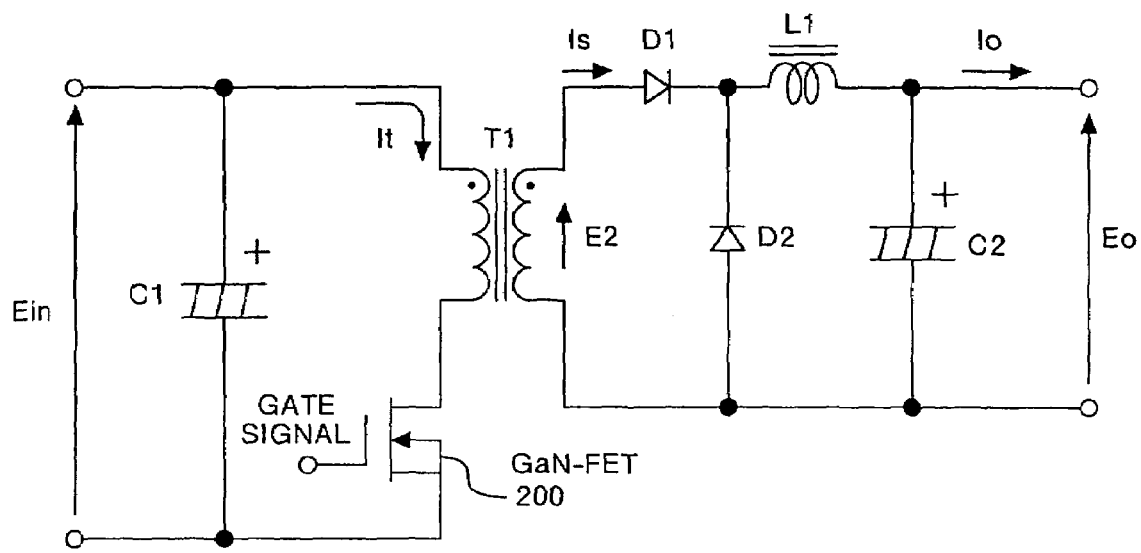
FIG. 10 is a circuit diagram showing an example of a configuration of a power supply circuit according to the present invention.
Figure 11:
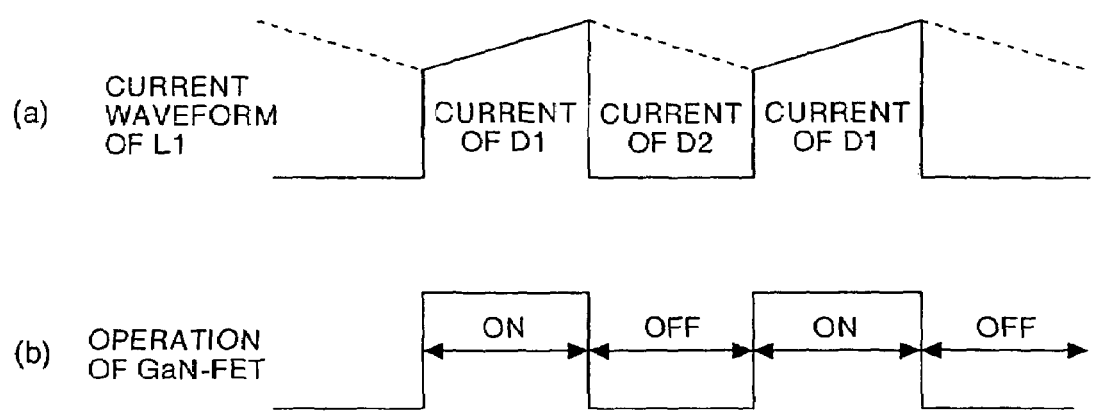
FIG. 11 is a waveform diagram showing the relation between the current of a coil L1 and on/off operation of a GaN-FET 11.

In FIG. 10, a power supply circuit is, for example, a switching power supply circuit (one-transistor forward type). It includes a transformer T1 supplied with an input voltage $E_{in}$, a GaN-FET 200 connected to a primary winding of the transformer T1, an electrolytic capacitor C1 connected in parallel with the primary winding of the transformer T1, a diode D1 and a coil L1 connected to a secondary winding of the transformer T1, and a diode D2 and an electrolytic capacitor C2 connected in parallel with the secondary winding of the transformer T1. On the secondary winding side, a voltage E2 is generated according to a winding ratio.

In the GaN-FET 200, for example, a GaN buffer layer 2 is formed on a semi-insulating sapphire substrate 1 as shown in FIG. 2. On the GaN buffer layer 2, a semi-insulating GaN layer 3 and an n-type AlGaN layer 4 are sequentially formed. In addition, on a part of a central portion of a surface layer portion of the n-type AlGaN layer 41d, a diffusion layer 4a with In and C or Mg doped is formed. On the diffusion layer 4a, an electrode of the gate G is loaded.

Furthermore, on the remaining portions of the surface layer portion of the n-type AlGaN layer 4, an n-type GaN layer 5 is formed. Over the remaining portions of the surface layer portion of the n-type AlGaN layer 4 and on one n-type GaN layer 5, an electrode of the source S is loaded. Over the other of the remaining portions of the surface layer portion of the n-type AlGaN layer 4 and on the other n-type GaN layer 5, an electrode of the drain D is loaded. Portions other than the electrodes of the gate G, the source S and the drain D are covered by an insulating film 6 of SiO.

Each of the semiconductor layers of the GaN-FET 200 shown in FIG. 2 is formed of a GaN compound semiconductor, and formed by using an epitaxial crystal growth method such as the MOCVD method or the MBE method. The term GaN compound semiconductor is a general term of GaN, AlGaN, InGaN, InAlGaN, InGaNAs, InGaNP and so on.

If a gate signal (for example, 100 kHz) is input to the gate of the GaN-FET 200, then the GaN-FET 200 turns on and off according to the gate signal. At this time, an input voltage $E_{in}$ is supplied to a primary winding of the transformer T1, and a voltage E2 is generated according to the winding ratio.

Assuming now that the ratio between the primary winding and the secondary winding is N1:N2, the voltage E2 becomes $$E2=(N2/N1){\times}E_{in}$$

At this time, a voltage of a positive direction is supplied to the diode D1, and consequently a current Is flows through the diode D1. Since this current Is charges the electrolytic capacitor C2 through the coil L1, E0 is output as an output voltage. At the same time, energy is stored within the coil L1 by the current flown through the coil L1.

If the GaN-FET 200 passes through an ON period and turns off, then transmission of power from the primary winding side through the transformer T1 disappears, and a voltage of an opposite polarity is generated in the coil L1. It is counter electromotive force caused by the energy stored in the coil L1 until then. By this counter electromotive force, such a current as to charge the electrolytic capacitor C2 is flown through the diode D2. By the way, the electrolytic capacitor C1 is a smoothing capacitor and functions so as to always input a flat voltage waveform to the transformer T1.

In this way, in the power supply circuit, the current that charges the capacitor C2 over the whole period continues to flow.

The gate of the GaN-FET 200 may be controlled by using an stabilizing circuit that monitors the load current, alters the on/off control time of the GaN-FET 200 according to the load variation, and obtains a stabilized output.

Design of a circuit using the GaN-FET 200 will now be described. When conducting such a circuit design, it has heretofore been necessary to conduct the radiation design of the FET accurately. Therefore, the design time becomes long, and it is necessary to consider the layout of the print board and the like. The degree of freedom of the layout is limited. In recent years, therefore, simplification and shortening of the radiation design of the FET have been desired.

On the other hand, in the present embodiment shown in FIG. 10, an output current of up to 30 A is obtained.

Therefore, a current $I_{t\_max}$ that flows the transformer T1 is obtained by the following equation.

$$I_{t\_max} = (N2/N1) \times I_{s\_max}$$

Assuming now that the ratio of the transformer T1 is N1:N2=3:1 and the ripple current is 30% of the output current $I_0$, the current $I_{s\_max}$ is $$I_{s\_max} = I_0 \times 1.15$$

Therefore, it is necessary to conduct on/off driving on a current of $$I_{t\_max} = (1/3) \times 30 \times 1.15 = 11.5 \text{ A}$$

with the GaN-FET 200.

Figure 12:
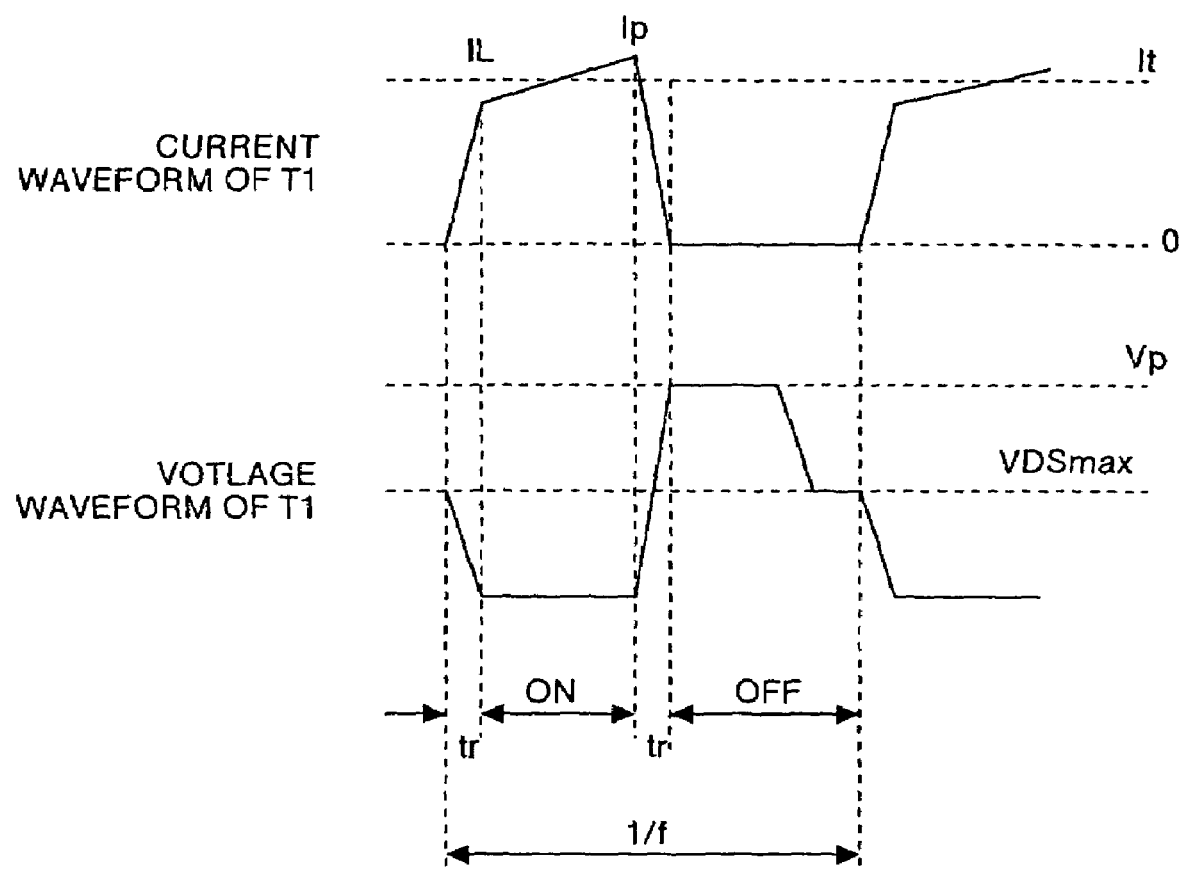
FIG. 12 is a waveform diagram showing current-voltage waveforms of a primary side of a transformer shown in FIG. 10.

From a switching waveform shown in FIG. 12, the total loss $P_{total}$ can be derived by the following equations $$P_{total} = P_{s(on)} + P_c + P_{s(off)}$$

$$P_{s(on)} = V_{DS\_max} \times I_L \times t_r \times f/6$$

$$P_c = R_{DS(on)} \times (I_L + I_p)^2 \times T_{on} \times f/2$$

$$P_{s(off)} = V_p \times I_p \times t_f \times f/6$$

where $P_{s(on)}$: turn-on loss
$P_c$: conduction loss
$P_{s(off)}$: turn-off loss
$V_{DS\_max}$: drain-source voltage
$I_L$: minimum drain current
$t_r$: turn-on time
f: frequency
$R_{DS(on)}$: on-resistance
$I_p$: maximum drain current
$T_{on}$: on-time
$V_p$: surge voltage
$t_f$: turn-off time For example, assuming that $V_{DS\_max}$=50 V, $t_r$=$t_f$=50 ns, f=100 kHz, $R_{DS(on)}$=0.013/100, $I_L$=10 A, $I_p$=11.5 A, $T_{on}$=4.9 μs, and $V_p$=60 V (see FIG. 12), it follows that $P_{s(on)}$=0.4 W
$P_c$=0.01 W
$P_{s(off)}$=0.57 W Therefore, the loss $P_{total}$ becomes $P_{total}$=0.4+0.01+0.57=0.98 W A channel temperature $T_{ch\_max}$ of the GaN-FET becomes $$\begin{aligned} T_{ch\_max} &= T_{a\_max} + P_{total} \times R_{th(ch-a)} \\ &= 85° \text{ C.} + 0.98 \text{ W} \times 50° \text{ C./W} \\ &= 129° \text{ C.} \end{aligned}$$

Even if a power supply circuit for outputting 30 A is to be constituted, it becomes possible to realize sufficient derating for the channel temperature without a radiation plate, because a GaN-FET, which generates less heat and which is capable of operating at high temperature (stable operation at 500° C. or higher), is used as the FET.

Thus, in the present embodiment, a GaN-FET, which is small in on-resistance Ron max and which is capable of operating at high temperature as compared with the conventional power MOS element, is used. As a result, the transistor does not generate heat, and the same operation as that of the conventional transistor can be conducted. In addition, the radiation plate becomes unnecessary. Accordingly, it becomes possible to reduce the manufacturing cost, reduce the work cost of the radiation plate, and reduce the size of the ECU.

Furthermore, in the present embodiment, the radiation design of the power supply circuit can be simplified and the circuit pattern design becomes easy. As a result, the design time of the ECU can be shortened.

The present invention is not limited to these embodiments. Without departing from the spirit of the present invention, various modifications can be carried out. In the present embodiment, one-transistor forward type has been described as an example of a switching power supply circuit. However, the present invention is not limited thereto, but the present invention can also be applied to power supply circuits of, for example, the chopper scheme, RCC scheme, and flyback scheme.

An embodiment of a large current load control apparatus according to the present invention will now be described.

Figure 13:
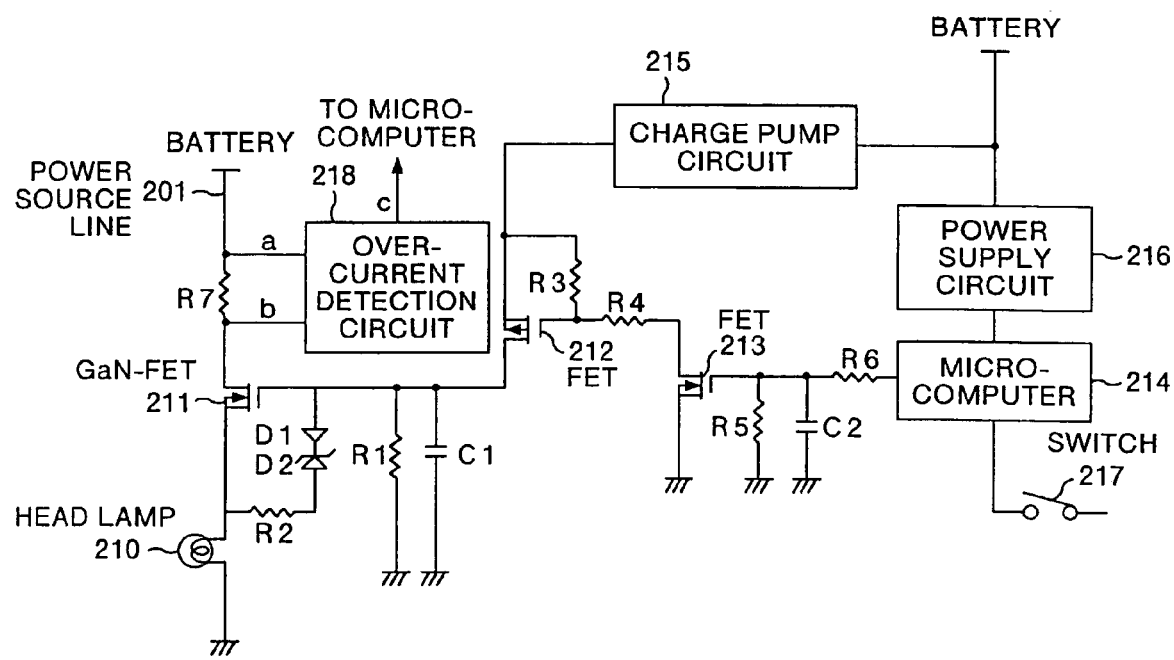
FIG. 13 is a circuit diagram showing a circuit configuration of a large current load control apparatus according to the present invention.
Figure 14:
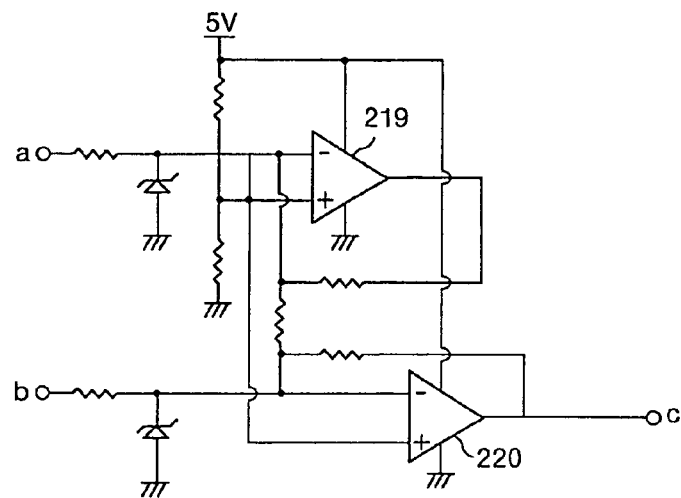
FIG. 14 is a circuit diagram showing a circuit configuration of an overcurrent detection circuit shown in FIG. 13.

FIG. 13 is a circuit diagram showing a circuit block of a large current load control apparatus used in head lamp control in an automobile. In the present invention, the circuit is formed by using a GaN-FET 211 instead of a power MOS-FET as an on/off control element of head lamps 210.

In the GaN-FET 211, for example, a GaN buffer layer 2 is formed on a semi-insulating sapphire substrate 1 as shown in FIG. 2. On the GaN buffer layer 2, a semi-insulating GaN layer 3 and an n-type AlGaN layer 4 are sequentially formed. In addition, on a part of a central portion of a surface layer portion of the n-type AlGaN layer 4, a diffusion layer 4a with In and C or Mg doped is formed. On the diffusion layer 4a, an electrode of the gate G is loaded.

Furthermore, on the remaining portions of the surface layer portion of the n-type AlGaN layer 4, an n-type GaN layer 5 is formed. Over the remaining portions of the surface layer portion of the n-type AlGaN layer 4 and on one n-type GaN layer 5, an electrode of the source S is loaded. Over the other of the remaining portions of the surface layer portion of the n-type AlGaN layer 4 and on the other n-type GaN layer 5, an electrode of the drain D is loaded. Portions other than each of the electrodes of the gate G, the source S and the drain D are covered by an insulating film 6 of SiO.

Each of the semiconductor layers of the GaN-FET 211 shown in FIG. 2 is formed of a GaN compound semiconductor, and formed by using an epitaxial crystal growth method such as the MOCVD method or the MBE method. The term GaN compound semiconductor is a general term of GaN, AlGaN, InGaN, InAlGaN, InGaNAs, InGaNP and so on.

In the present embodiment, FIG. 13 shows a high-side drive circuit formed by connecting the GaN-FET 211 to a power source line 201 between a battery serving as an internal power source and the head lamps 210 serving as electric loads. The drain of the GaN-FET 211 is connected to the battery. The source is connected to two head lamps 210. A resistor R1 and a capacitor C1 are connected to the gate of the GaN-FET 211. In addition, a microcomputer 214 serving as a control circuit is also connected to the gate of the GaN-FET 211 via a FET 212 and a FET 213. Under the control of the microcomputer 214, the GaN-FET 211 conducts on/off operation. Furthermore, between the gate and the source, a diode D1, a Zener diode D2 and a resistor R2 are connected in series.

A charge pump circuit 215 is connected to the FET 212 at its source. Between the source and gate of the FET 212, a resistor R3 is connected to raise the voltage supplied to the FET 212. A resistor R4 is connected to the gate of the FET 212. Resistors R5 and R6 and a capacitor C2 are connected to the gate of the FET 212. In addition, the microcomputer 214 is also connected to the gate of the FET 212.

The microcomputer 214 is connected to the battery via a power supply circuit 216. The power supply circuit 216 performs conversion on the power supply voltage supplied from the battery, and supplies a resultant voltage to the microcomputer 214. A switch 217 for conducting on/off switchover of the head lamps 210 is connected to the microcomputer 214. In the present embodiment, the switch 217 for on/off switchover is used. However, on/off control may be conducted by using a CAN (control area network), which is an intra-vehicle LAN (local area network), or the like.

If the switch 217 assumes the on-state in the above described large current load control apparatus, then the microcomputer 214 senses the on-state from an input port connected to the switch 217, and outputs a signal of a high level (5 V) to an output port for controlling the head lamps 210. By this output, the FETs 212 and 213 are turned on. The GaN-FET 211 is controlled so as to turn on, and the head lamps 210 are lit. In the present embodiment, the GaN-FET 211 is located on the upstream side (battery side) of the head lamps 210. Because of such high side drive, there is the charge pump circuit 215 on the source side of the FET 212. This charge pump circuit 215 is set so as to input a voltage that is equal to at least the sum of the battery voltage and the gate-source voltage of the GaN-FET 211 to the gate of the GaN-FET 211 in order to turn on the GaN-FET 211. The charge pump circuit 215 of the present embodiment is set so as to, for example, convert the battery voltage to 21 V and supply the 21 V to the gate of the GaN-FET 211.

Furthermore, if the switch 217 turns off, the microcomputer 214 senses the off-state, and outputs a low level (0 V) to the output port for controlling the head lamps 210. By this output, the FETs 212 and 213 are turned off. The GaN-FET 211 is controlled so as to turn off, and the head lamps 210 are put out.

Furthermore, in the present embodiment, a shunt resistor R7 is connected between the GaN-FET 211 and the battery, and an overcurrent detection circuit 218 is connected across the shunt resistor R7 to detect an overcurrent that flows through the GaN-FET 211. As shown in FIG. 3, the overcurrent detection circuit 218 includes two operational amplifiers 219 and 220. The overcurrent detection circuit 218 amplifies and detects a current that flows through the shunt resistor R7, and outputs a result of detection to the microcomputer 214. If an excessive current continuously flows, then the wire harness is heated and there is a possibility of degradation and smoke emitting. On the basis of a result of the detection, the microcomputer 214 exercises control so as to turn off the GaN-FET 211.

Design of a circuit using the GaN-FET 211 will now be described. When conducting such a circuit design, it has heretofore been necessary to conduct the radiation design of the FET accurately. Therefore, the design time becomes long, and it is necessary to consider the layout of the print board and the like. The degree of freedom of the layout is limited. In recent years, therefore, simplification and shortening of the radiation design of the FET have been desired.

On the other hand, in the present embodiment shown in FIG. 13, power of 60 W×2=120 W is required to turn on two head lamps 210. In a steady state, a maximum current of approximately 10 A flows. From equation (10), therefore, the channel temperature of the GaN-FETs 211 at an ambient temperature of 85° C. is calculated as $$T_{ch\_max} = 85°\ C. + (0.013\,\Omega/100) \times 10\ A \times 10\ A \times 50°\ C./W$$

$$= 85.65°\ C.$$

Even if a current of 10 A is always flown, heat is generated at all. Accordingly, the radiation plate required when the power MOS-FETs are used becomes unnecessary.

Furthermore, in the case where a large current load control apparatus is used in a severe temperature environment such as an engine room, the use temperature range of the apparatus is required to be at least 125°. By using GaN-FETs capable of operating at high temperature (operating stably even at 500°) different from the conventional MOS-FETs, it is possible to set sufficient derating (at least 500°) with respect to the channel temperature, and design of a highly reliable, small-sized ECU is facilitated.

Thus, in the present embodiment, GaN-FETs, which are small in on-resistance $R_{on\_max}$ as compared with the conventional power MOS elements, are used. As a result, on/off control elements do not generate heat, and the same operation as that of the conventional on/off control elements can be conducted. In addition, the radiation plate becomes unnecessary. Accordingly, it becomes possible to reduce the manufacturing cost, reduce the work cost of the radiation plate, and reduce the size of the ECU.

Furthermore, in the present embodiment, the radiation design of the circuit can be simplified and the circuit pattern design becomes easy. As a result, the design time of the ECU can be shortened.

Figure 15:
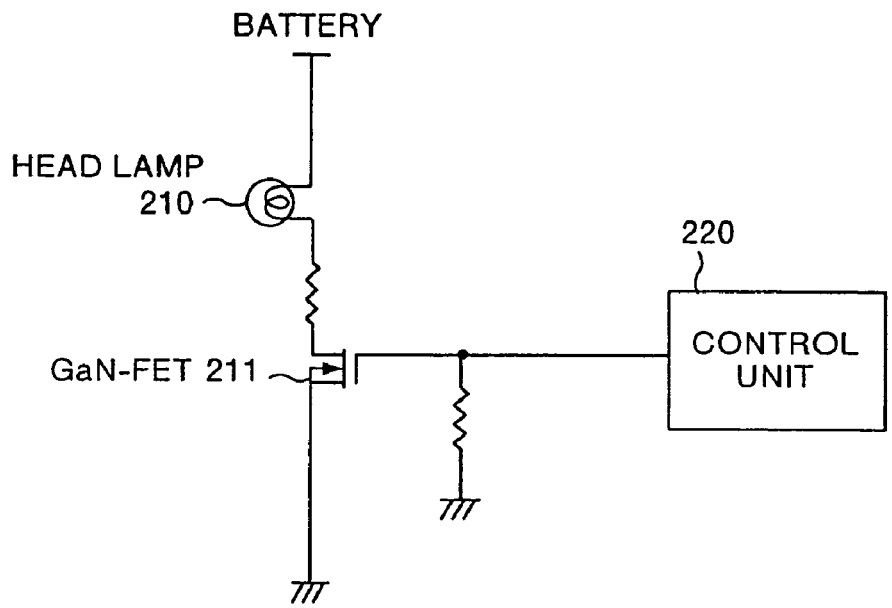
FIG. 15 is a circuit diagram showing another circuit configuration of a large current load control apparatus according to the present invention.
Figure 16:
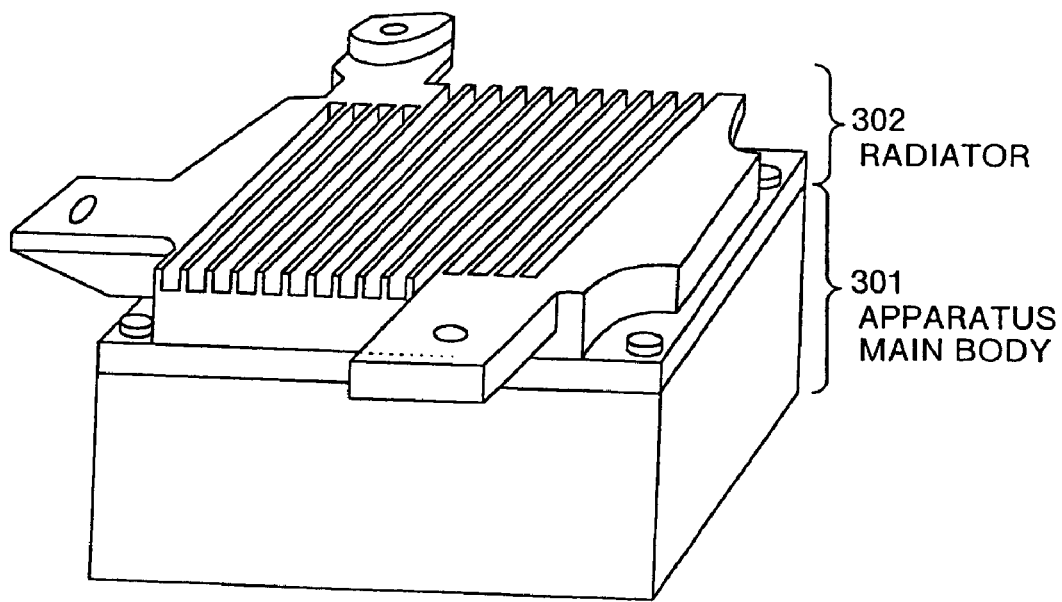
FIG. 16 is an oblique view showing a configuration of a conventional power supply apparatus.

The present invention is not limited to these embodiments. Without departing from the spirit of the present invention, various modifications can be carried out. In the present embodiment, a suitable example of a high-side type head lamp control circuit for automobile has been described. However, the present invention is not limited thereto, but it is also possible to adopt, for example, a low-side drive circuit configuration having a GaN-FET 211 connected between a head lamp 210 and GND as shown in FIG. 15. In FIG. 15, a control unit 220 is obtained by incorporating elements, such as a microcomputer and the FET for conducting on/off control on the GaN-FET 211, in a unit.

Furthermore, as for the GaN-FET, any of a GaN-FET of N-channel type and a GaN-FET of P-channel may be used.

Furthermore, a large current load control apparatus according to the present invention may be used for control of, for example, tail lamps or fog lamps, other than head lamps. Or a large current load control apparatus according to the present invention may have functions of these lamps controls together. In addition, it is also possible to use a large current load control apparatus according to the present invention for motor control, for example on/off control of a load, such as a floor motor or wiper motor (HI, LOW, INT, MIST) for automobiles.

As heretofore described, according to a power supply apparatus according to the present invention, a semiconductor element formed by using a GaN compound is disposed in the path of a main current that is a subject of power control, and control unit controls conduction of the main current flowing through the semiconductor element. Since the semiconductor element is small in resistance at the time of conduction, little heat is generated and it becomes unnecessary to provide the power supply apparatus with a radiator having a large weight and a large volume. This brings about an effect that reduction of the power supply apparatus in size and weight can be realized and the time and labor required for radiation design can be remarkably reduced. Furthermore, it becomes unnecessary to make the semiconductor element stick to a radiator. The semiconductor element can be disposed in an arbitrary position in the power supply apparatus. This brings about an effect that the degree of freedom in the design of the power supply apparatus is increased in addition to easiness of the radiation design, eventually making possible integration of elements arranged in the power supply apparatus, and reduction of the power supply apparatus in size and weight is further promoted. In addition, there is brought about an effect that the thermal runaway is eliminated and consequently a thermal protection circuit such as an overcurrent protection circuit can be simplified.

Furthermore, according to a power supply apparatus according to the present invention, a semiconductor element formed by using a GaN compound disposed in the path of a main current that is a subject of power control, and control unit conducts switching control on conduction of the main current flowing through the semiconductor element. Since the semiconductor element is small in resistance at the time of conduction, little heat is generated and it becomes unnecessary to provide the power supply apparatus with a radiator having a large weight and a large volume. This brings about an effect that reduction of the power supply apparatus in size and weight can be realized and the time and labor required for radiation design can be remarkably reduced. Furthermore, it becomes unnecessary to make the semiconductor element stick to a radiator. The semiconductor element can be disposed in an arbitrary position in the power supply apparatus. This brings about an effect that the degree of freedom in the design of the power supply apparatus is increased in addition to easiness of the radiation design, eventually making possible integration of elements arranged in the power supply apparatus, and reduction of the power supply apparatus in size and weight is further promoted. In addition, there is brought about an effect that the thermal runaway is eliminated and consequently a thermal protection circuit such as an overcurrent protection circuit can be simplified.

Furthermore, according to a power supply apparatus according to the present invention, the power supply apparatus includes a plurality of the semiconductor elements disposed in the path of a main current that is a subject of power control, and the plurality of semiconductor elements are connected in parallel. The limit of the main current that can be controlled is remarkably improved. In addition, the semiconductor elements generate little heat. This brings about an effect that a power supply apparatus having high power control capability can be implemented by using a power supply apparatus having nearly the same weight and volume as those of a power supply apparatus equipped with one semiconductor element.

Furthermore, according to a power supply apparatus according to the present invention, the power supply apparatus includes a plurality of semiconductor elements disposed in the path of a main current that is a subject of power control, and when connecting the semiconductor elements in parallel, the semiconductor elements in the power supply apparatus are arranged so as to be adjacent to each other, because the semiconductor elements themselves generate little heat. This brings about an effect that the degree of freedom of design can be further improved.

Furthermore, according to a power supply apparatus according to the present invention, the semiconductor element disposed in the path of a main current that is a subject of power control is formed of a GaN-FET, and the resistance at the time of conduction is made extremely small. Thus, heat generated by the semiconductor element is made little. This brings about an effect that reduction of the power supply apparatus in size and weight is further promoted and the time and labor required for design including the radiation design can be remarkably decreased.

Furthermore, according to a power supply circuit according to the present invention, a GaN-FET, which is small in generated heat, is used as a switching element of the power supply circuit. This brings about an effect that reduced heat generation of the switching element makes the radiation plate unnecessary and the power supply circuit can be reduced in size and weight.

Furthermore, according to a large current load control apparatus according to the present invention, a GaN-FET, which is small in generated heat and which can operate at high temperature (at least 500° C.), is used as an on/off control switching element of the large current load control apparatus. This brings about an effect that reduced heat generation of the switching element makes the radiation plate unnecessary and the power supply circuit can be reduced in size and weight.

The diodes in the circuits as shown in figures may be made from GaN compound semiconductor. A diode made from a GaN compound semiconductor (hereinafter, "GaN-diode") has an on-resistance per unit area and a conduction loss which are smaller than those of a Si semiconductor diode, like the GaN-FET. The GaN-diode is more stable under high temperatures than that of a Si semiconductor diode. Therefore, it is effective to use the GaN-diode to bring advantages of the GaN-FET with a low conduction loss and high temperature operation. In paticulat, it is preferable to use the GaN-diodes in place of the diodes disposed in the path of a main current. Such replaceable diodes are for example the diodes D1 and D2 in FIG. 6, the diode D3 in FIG. 7, the diodes used in the secondary winding side of the switching regulator circuit in FIG. 8, the diodes used in the rectifier circuit of the power supply apparatus, and the diodes D1 and D2 in FIG. 10.

Figure 17:
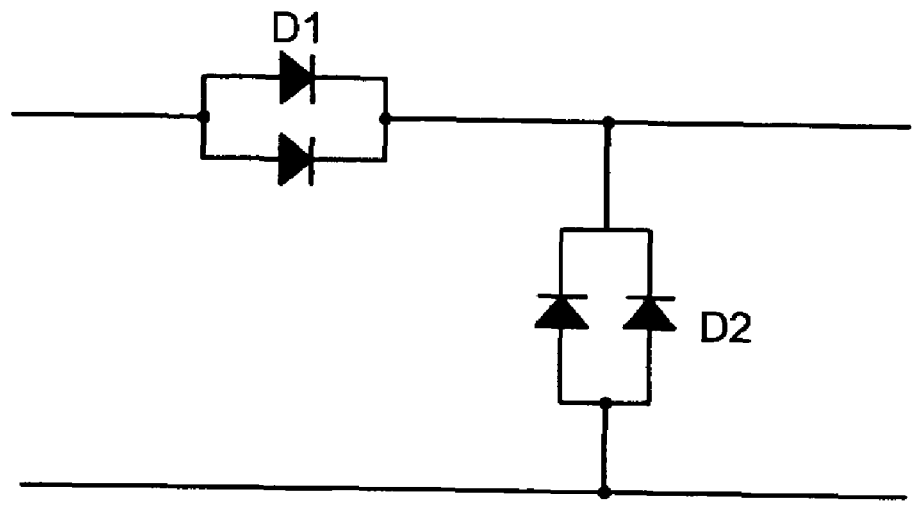
FIG. 17 shows a circuit including GaN diodes which are connected in parallel to each other.

These diodes may be arranged in parallel. In the circuit of the power supply apparatus shown in FIG. 6, the diodes D1 and D2 may be arranged as shown in FIG. 17, for example. The GaN-diodes allow adjacent arrangement because of their low heating value, and thus parallel connection thereof. As a result, the maximum current value of the power supply apparatus can be doubled.

Figure 18:
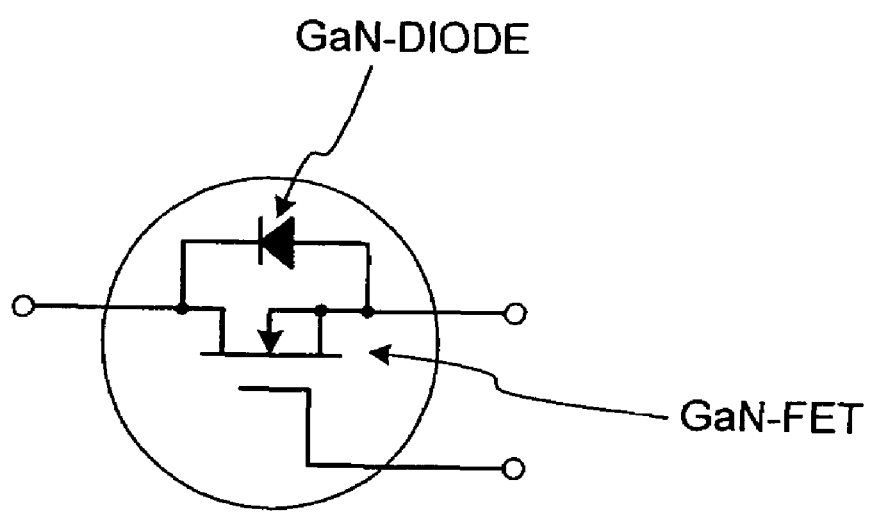
FIG. 18 shows a GaN-diode serving as a flywheel diode.

A circuit with an FET, in general, includes a protection diode for the FET. A protection diode for a GaN-FET is preferably a GaN-diode. Such a GaN-diode used as a protection diode may be connected to a GaN-FET as shown in FIG. 18. This GaN-diode is arranged in parallel with the GaN-FET, and serves as a flywheel diode. In an inductor circuit including a winding, an alternating voltage applied to the inductor circuit, for example at power on/off, generates a back electromotive force. The flywheel diode is used to protect the GaN-FET from the back electromotive force.

Figure 19:
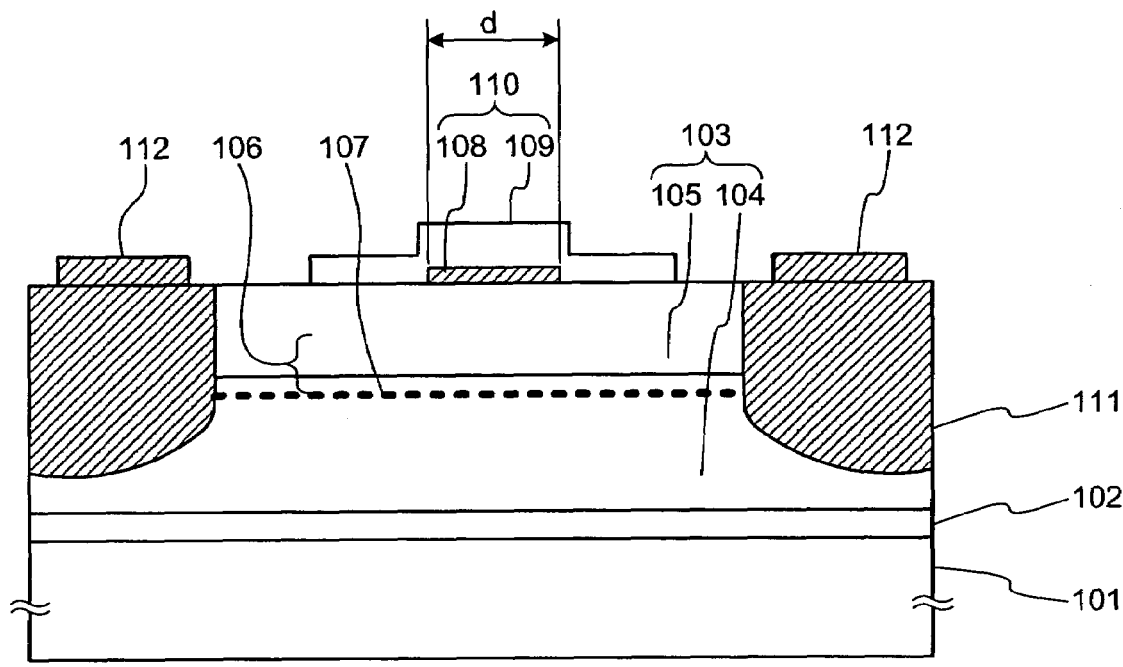
FIG. 19 is a sectional view of an example of the GaN-diode.

FIG. 19 shows one example of the GaN-diode as described above. A GaN-diode shown in FIG. 19 includes an insulating or semi-insulating substrate 101, a buffer layer 102 formed on the substrate 101, and a III-V nitride semiconductor layer (GaN layer) 103 formed on the buffer layer 102. This GaN-diode also includes a first anode electrode 108 having a width d (preferably, of 0.3 to 2 µm, for example 2 µm) and forming a Schottky junction with the semiconductor layer 103, and a second anode electrode 109 forming a Schottky junction with the semiconductor layer 103 so as to cover and be electrically connected to the first anode electrode 108. The first anode electrode 108 and the second anode electrode 109 constitute a composite anode electrode 110.

In this GaN-diode, the Schottky barrier between the first anode electrode 108 and the semiconductor layer 103 is lower than the Schottky barrier between the second anode electrode 109 and the semiconductor layer 103.

The first anode electrode 108 with the lower Schottky barrier acts prior to the second anode electrode 109 immediately after a voltage is applied to the anode electrode 110 in the forward direction. The second anode electrode 109 acts after the forward voltage increases up to a predetermined level. Thus, the rising of the forward current becomes quick, so that the on-resistance becomes zero and the on-voltage becomes approximately zero. When a voltage is applied to the anode electrode 110 in the reverse direction, a depletion layer widens in semiconductor layer right under the second anode electrode 109, so that the current path is pinched off, stopping the current flow. In other words, the GaN-diode provides the diode characteristic.

In the GaN-diode according to the embodiment, the III-V nitride semiconductor layer 103 has a heterostructure 106 that includes a pair of a low bandgap layer 104 and a high bandgap layer 105. The heterostructure 106 exhibits the piezoelectric effect at the interface between the layers 104 and 105 with different bandgap. This piezoelectric effect causes a two-dimensional electron gas layer 107 in the low bandgap layer 104 near the interface.

When the anode electrode 110 is forward biased, a current flows through the anode electrode 110, the high bandgap layer 105, and the two-dimensional electron gas layer 107 in the low bandgap layer 104, in order.

Since the two-dimensional electron gas layer 107 has a high electron mobility, a resistance to the flow of the current in this layer is very low. Therefore, the on-resistance becomes more lower by the two-dimensional electron gas layer 107 in the path of a current flowing from a cathode electrode 112.

The cathode electrode 112 of the GaN-diode forms an ohmic contact with a contact layer 111. The contact layer 111 is in contact with the low bandgap layer 104, and thus the two-dimensional electron gas layer 107 is electrically connected to the contact layer 111.

Figure 20:
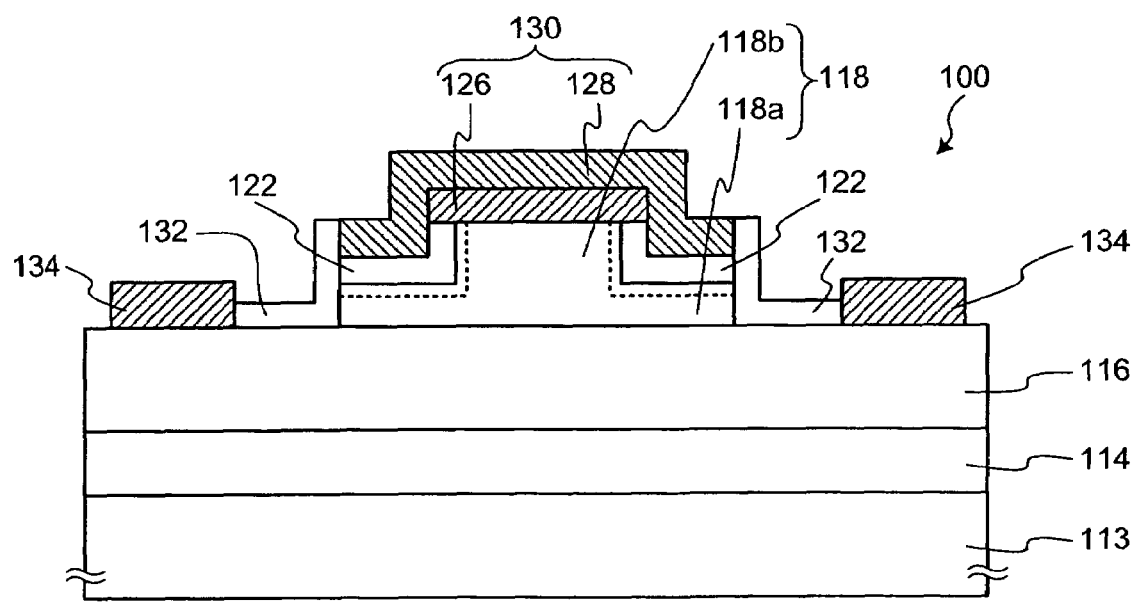
FIG. 20 is a sectional view of another example of the GaN-diode.

FIG. 20 shows another example of the GaN-diode. A GaN Schottky diode 100 shown in FIG. 20 includes an insulating or semi-insulating sapphire substrate 113, a GaN buffer layer 114 having a thickness of 50 nm and formed on the substrate 113, and n$^+$-GaN layer 116 having a thickness of 2000 nm and formed on the buffer layer 114. An n-GaN layer 118 is formed on the n$^+$-GaN layer 116. The n-GaN layer 118 includes a plane portion 118a having a thickness of 500 nm and a convex portion 118b protruded from the central of the surface of the plane portion 118a. The convex portion 118b has a width of 2000 nm and a height of 2000 nm. The impurity concentration of the n-GaN layer 118 is as low as preferably not more than $2 \times 10^{17}$ cm$^{-3}$ (for example, approximately $2 \times 10^{17}$ cm$^{-3}$). This is because although a reverse bias to the GaN Schottky diode 100 widens a depletion layer in the n-GaN layer 118, an excessive impurity concentration does not widen the depletion layer, thereby causing no pinch off state, as described later.

The GaN Schottky diode 100 also includes an undoped $Al_{0.2}Ga_{0.8}N$ layer 122, a Ti (titanium) electrode 126, and a Pt (platinum) electrode 128. The $Al_{0.2}Ga_{0.8}N$ layer 122 has a thickness of 30 nm and a bandgap higher than that of the n-GaN layer 118, and covers the surface of the plane portion 118a and the side of the convex portion 118b. The Ti electrode 126 forms a Schottky junction on the top of the convex portion 118b, and serves as a first anode electrode. The Pt electrode 128 is formed on the Ti electrode 126 and the $Al_{0.2}Ga_{0.8}N$ layer 122, and serves as a second anode electrode. The Pt electrode 128, concretely, is electrically connected to the Ti electrode 126, and forms a Schottky junction via the $Al_{0.2}Ga_{0.8}N$ layer 122 to connect with the side of the convex portion 118b. The Ti electrode 126 and the Pt electrode 128 constitute a composite anode electrode 130.

An SiO$_2$ film 132 covers the sides of the Pt electrode 128, the $Al_{0.2}Ga_{0.8}N$ layer 122, and the plane portion 118a and a part of the surface of the n$^+$-GaN layer 116. A cathode electrode 134 is made from a TaSi layer, and forms an ohmic contact with the n$^+$-GaN layer 116 (outer of the part of the surface).

A heterojunction is formed between the n-GaN layer 118 and the $Al_{0.2}Ga_{0.8}N$ layer 122. A two-dimensional electron gas layer occurs near the interface of the heterojunction as indicated by a dashed line in FIG. 20. A Schottky barrier with a height of 0.3 eV is formed at a contact surface between the Ti electrode 126 and the n-GaN layer 118. According to this embodiment, the Schottky junction is not formed at the interface between the Pt electrode 128 and the n-GaN layer 118. If the Schottky junction is formed at the interface, a Schottky barrier with a height of 1.0 eV is formed at the interface.

The first anode electrode may be made of metal which forms a Schottky barrier with a height lower than the n-GaN layer 118 by less than 0.8 eV, such as W (tungsten) and Ag (silver), instead of Ti. The second anode electrode may be made of metal which forms a Schottky barrier with a height higher than the n-GaN layer 118 by more than 0.8 eV, such as Ni (nickel), Pd (palladium), and Au (gold), instead of Pt.

The first anode electrode and the second electrode with a Schottky barrier higher than that of the first anode electrode to a GaN semiconductor layer makes the diode with a low on-resistance and a low reverse current leakage.

As heretofore described, according to a power supply apparatus according to the present invention, a semiconductor element formed by using a GaN-diode is disposed in the path of a main current that is a subject of power control. Since the semiconductor element is small in resistance at the time of conduction, and little heat is generated, the semiconductor element can be disposed in an arbitrary position in the power supply apparatus. This brings about an effect that the degree of freedom in the design of the power supply apparatus is increased in addition to easiness of the radiation design. In addition, there is brought about effects that reduction of the power supply apparatus in size and weight is further promoted, and the time and labor required for radiation design can be remarkably reduced.

As heretofore described, the power supply apparatus, the power supply circuit, and the large current load control apparatus are useful for automobiles, electric vehicles, construction machinery, various public welfare devices (such as video devices, television sets, and audio devices), various industrial devices (such as personal computers, communication devices, and FA control devices), and so on. They are suitable for realizing reduction in size and weight of an apparatus or circuit.

What is claimed is:
1. A power supply apparatus comprising:
 a field effect transistor (FET) that is disposed in a path of a main current that is a subject of power control, the FET including:

a first gallium-nitride buffer layer,
a first gallium-nitride layer formed on the first gallium-nitride buffer layer,
a first n-type aluminum-gallium-nitride layer formed on the first gallium-nitride layer, and
a control unit which conducts switching control on conduction of the main current flowing through said FET; and
a diode that is disposed in the path of the main current that is switched on and off by the FET, the diode including a second gallium-nitride buffer layer,
a second gallium-nitride layer formed on the second gallium-nitride buffer layer, and
a second n-type aluminum-gallium-nitride layer formed on the second gallium-nitride layer.

2. The power supply apparatus according to claim 1, wherein said diode is provided in plurality, and said diodes are connected in parallel.

3. The power supply apparatus according to claim 2, wherein said diodes are arranged so as to be adjacent to each other.

4. The power supply apparatus according to claim 1, wherein said power supply apparatus is installed in an automobile.

5. The power supply apparatus according to claim 1, wherein said power supply apparatus is installed in an electric vehicle.

6. The power supply apparatus according to claim 1, wherein said power supply apparatus is installed in a consumer appliance.

7. The power supply apparatus according to claim 1, wherein said power supply apparatus is installed in an industrial device.

8. The power supply apparatus according to claim 1, wherein said diode includes:
a first anode electrode forming a Schottky junction with said second gallium-nitride layer;
a second anode electrode forming a Schottky junction with a portion of said second gallium-nitride layer other than a portion at which said first anode electrode is in contact with said second gallium-nitride layer, said second anode electrode being electrically connected to said first anode electrode, a Schottky barrier formed between said first anode electrode and said second gallium-nitride layer being lower in height than that formed between said second anode electrode and said second gallium-nitride layer.

9. The power supply apparatus of claim 1, wherein the FET is coupled to a primary winding of a transformer, said FET switching current to the primary winding on and off.

10. The power supply apparatus of claim 9, wherein the FET comprises a plurality of FETs, each of the plurality of the FETs being coupled to said primary winding of the transformer, the each of the plurality of the FETs switching current to the primary winding on and off.

11. The power supply apparatus of claim 9, wherein said diode is connected in series with a secondary winding of said transformer.

12. The power supply apparatus of claim 9, wherein said diode is connected in parallel with a secondary winding of said transformer.

13. The power supply apparatus of claim 11, further comprising another diode connected in parallel with said secondary winding of said transformer, said another diode comprising:

a third gallium-nitride buffer layer,
a third gallium-nitride layer formed on the third gallium-nitride buffer layer, and
a third n-type aluminum-gallium-nitride layer formed on the third gallium-nitride layer.

14. The power supply apparatus of claim 13, wherein cathodes of said diodes are connected to each other and anodes of said diodes are connected to first and second terminals of the secondary winding of the transformer respectively.

15. The power supply apparatus of claim 13, wherein said secondary winding of said transformer comprises a center terminal and a voltage output of said power supply apparatus is provided across said center terminal and a terminal connected to the cathode terminals of said diodes.

16. The power supply apparatus of claim 1, wherein said diode is provided in a rectifier circuit of said power supply apparatus.

17. The power supply apparatus of claim 16, further comprising an inductor and capacitor coupled to said diode.

18. The power supply apparatus of claim 17, wherein said inductor and capacitor are provided between said diode and a voltage output of said power supply apparatus.

19. A power supply circuit having a transformer, and which conducts on/off control on voltage applied to a primary winding of said transformer, and thereby supplies a stabilized power supply voltage to a secondary winding side of said transformer, further comprising:
a GaN-FET including:
a first gallium-nitride buffer layer,
a first gallium-nitride layer formed on the first gallium-nitride buffer layer, and
a first n-type aluminum-gallium-nitride layer formed on the first gallium-nitride layer, the GaN-FET being connected to the primary winding of said transformer and on/off controlled by a gate signal; and
a GaN-diode including
a second gallium-nitride buffer layer,
a second gallium-nitride layer formed on the second gallium-nitride buffer layer, and
a second n-type aluminum-gallium-nitride layer formed on the second gallium-nitride layer, the GaN-diode being connected to the secondary winding of said transformer and on/off-controlled by a gate signal.

20. The power supply circuit according to claim 19, wherein said GaN-diode includes:
a first anode electrode forming a Schottky junction with said second gallium-nitride layer;
a second anode electrode forming a Schottky junction with a portion of said second gallium-nitride layer other than a portion at which said first anode electrode is in contact with said second gallium-nitride layer, said second anode electrode being electrically connected to said first anode electrode, a Schottky barrier formed between said first anode electrode and said second gallium-nitride layer being lower in height than that formed between said second anode electrode and said second gallium-nitride layer.

* * * * *